(12) United States Patent
Ramachandran et al.

(10) Patent No.: US 11,824,015 B2
(45) Date of Patent: Nov. 21, 2023

(54) STRUCTURE AND METHOD FOR SEALING A SILICON IC

(71) Applicant: Apple Inc., Cupertino, CA (US)

(72) Inventors: Vidhya Ramachandran, Cupertino, CA (US); Sanjay Dabral, Cupertino, CA (US); SivaChandra Jangam, Milpitas, CA (US); Jun Zhai, Cupertino, CA (US); Kunzhong Hu, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/397,834

(22) Filed: Aug. 9, 2021

(65) Prior Publication Data

US 2023/0040308 A1 Feb. 9, 2023

(51) Int. Cl.
*H01L 23/00* (2006.01)
*H01L 21/78* (2006.01)
(Continued)

(52) U.S. Cl.
CPC ............ *H01L 23/562* (2013.01); *H01L 21/78* (2013.01); *H01L 23/544* (2013.01);
(Continued)

(58) Field of Classification Search
CPC ..... H01L 23/562; H01L 21/78; H01L 23/544; H01L 23/564; H01L 23/585; H01L 2223/5446
See application file for complete search history.

(56) References Cited

U.S. PATENT DOCUMENTS 6,003,107 A 12/1999 Ranson et al.
7,233,071 B2 6/2007 Furukawa et al.
(Continued)

FOREIGN PATENT DOCUMENTS

CN 112018027 A 12/2020
KR 20180091307 A 8/2018
(Continued)

OTHER PUBLICATIONS

PCT/US2022/074392, "PCT Notification of Transmittal of the International Search Report and the Written Opinion of the International Searching Authority, or the Declaration", dated Nov. 17, 2022, 10 pages.
(Continued)

*Primary Examiner* — Thanh T Nguyen
(74) *Attorney, Agent, or Firm* — Aikin & Gallant, LLP

(57) ABSTRACT

Chip sealing structures and methods of manufacture are described. In an embodiment, a chip structure includes a main body area formed of a substrate, a back-end-of-the-line (BEOL) build-up structure spanning over the substrate, and chip edge sidewalls extending from a back surface of the substrate to a top surface of the BEOL build-up structure and laterally surrounding the substrate and the BEOL build-up structure. In accordance with embodiments, the chip structure may further include a conformal sealing layer covering at least a first chip edge sidewall of the chip edge sidewalls and a portion of the top surface of the BEOL build-up structure, and forming a lip around the top surface of the BEOL build-up structure.

18 Claims, 13 Drawing Sheets

(51) Int. Cl.
*H01L 23/58* (2006.01)
*H01L 23/544* (2006.01)
(52) U.S. Cl.
CPC .......... *H01L 23/564* (2013.01); *H01L 23/585* (2013.01); *H01L 2223/5446* (2013.01)

(56) References Cited

U.S. PATENT DOCUMENTS

| | | | |
|---|---|---|---|
| 7,482,675 | B2 | 1/2009 | Adkisson et al. |
| 7,518,229 | B2 | 4/2009 | Cotte et al. |
| 8,164,171 | B2 | 4/2012 | Lin et al. |
| 8,198,174 | B2 | 6/2012 | Hsu et al. |
| 9,837,366 | B1 | 12/2017 | Liu et al. |
| 10,276,514 | B1 | 4/2019 | Wang et al. |
| 10,283,501 | B2 | 5/2019 | Macelwee et al. |
| 10,438,896 | B2 | 10/2019 | Dabral et al. |
| 10,515,939 | B2 | 12/2019 | Chen et al. |
| 10,644,826 | B2 | 5/2020 | Wuu et al. |
| 10,985,107 | B2 | 4/2021 | Dabral et al. |
| 2008/0277765 | A1* | 11/2008 | Lane ............ H01L 21/78 257/E21.546 |
| 2009/0160029 | A1 | 6/2009 | Pitts et al. |
| 2010/0193931 | A1 | 8/2010 | Do et al. |
| 2013/0256659 | A1 | 10/2013 | Tsai et al. |
| 2014/0120696 | A1 | 5/2014 | Aleksov et al. |
| 2014/0273463 | A1 | 9/2014 | Shamiryan et al. |
| 2014/0319522 | A1 | 10/2014 | Daubenspeck et al. |
| 2015/0214110 | A1 | 7/2015 | Lin et al. |
| 2015/0262844 | A1 | 9/2015 | Meyer et al. |
| 2015/0294954 | A1 | 10/2015 | Leung et al. |
| 2017/0025471 | A1* | 1/2017 | Bhushan ............ H10B 61/22 |
| 2018/0294230 | A1 | 10/2018 | Dabral et al. |
| 2019/0181170 | A1 | 6/2019 | Oishi et al. |
| 2020/0075497 | A1 | 3/2020 | Dabral et al. |
| 2020/0105682 | A1 | 4/2020 | Liu et al. |
| 2020/0176419 | A1 | 6/2020 | Dabral et al. |
| 2021/0013139 | A1 | 1/2021 | Kim |

FOREIGN PATENT DOCUMENTS

| | | |
|---|---|---|
| TW | 201822309 A | 6/2018 |
| TW | 201919160 A | 5/2019 |
| WO | 2019060798 A1 | 3/2019 |

OTHER PUBLICATIONS

J.S. Choi, "Next Big Thing: DDR4 3DS", Received from https://www.jedec.org/sites/default/files/files/JS_Choi_Server_Forum_2014(1).pdf, JEDEC, 2014, 19 pages.
Daly, Denis C., "Through the Looking Glass—2020 Edition", Received from https://ieeexplore.ieee.org/stamp/stamp.jsp?tp=&arnumber=8967270, IEEE Solid-State Circuits Magazine, 2020, 17 pages.
IBM, "Power9—Microarchitectures—IBM" Received from https://en.wikichip.org/wiki/ibm/microarchitectures/power9, WikiChip, Aug. 2017, 15 pages.
"ASML Products & Services: Supplying the Semiconductor Industry." ASML Products & Services | Supplying the Semiconductor Industry, <www.asml.com/en/products>, accessed from the Internet on Dec. 23, 2020.
K.K, Hamamatsu Photonics. "Stealth Dicing™ Process vs. Ordinary Dicing Methods." Stealth Dicing™ Process, sd.hamamatsu.com/jp/en/SD_outline/SD_comparison.html. accessed from the Internet on Dec. 23, 2020.
"DISCO Corporation", received from https://www.disco.co.jp/eg/index.html, accessed from the Internet on Dec. 23, 2020. 5 pages.
Leighton et al., "Wafer-Scale Integration of Systolic Arrays", Received from https://ieeexplore.ieee.org/document/4568404, I23rd Annual Symposium on Foundations of Computer Science (sfcs 1982), Nov. 3-5, 1982, 14 pages.
McDonald et al., "Wafer scale Integration (WSI) of Programmable Gate Arrays (PGA's)", Received from https://ieeexplore.ieee.org/document/63917, 1990 Proceedings. International Conference on Wafer Scale Integration, Jan. 23-25, 1990, 10 pages.
IMAPS "3D Technology Trends & Key Manufacturing Challenges, Focus on Lithography" Retrieved from: http://www.imapsne.net/2015%20Presentations/Keynote_2015_YOLE.pdf, From Technologies to Market. IMAPS—Lunch Keynote. YOLE Development. May 2015, on Oct. 8, 2017, 34 pages.
Heidelberg Instruments, "VPG series, High Speed Pattern Generator", Retrieved on Oct. 8, 2017 from: http://www.himt.de/files/Factshele8t%20Download/HIMT%20Fact%20Sheet%20VPG%20Series%20200-400.pdf, 2 pages.
Martin van den Brink,"Litho today, litho tomorrow", ASML, Received from https://www.asml.com/-/media/asml/files/investors/investor-days/2016/litho-today-litho-tomorrow-martin-van-den-brink.pdf, Oct. 31, 2016, 44 pages.
Michael Thompson, "Introduction to Flexible Electronics I", MS&E Cornell University Life ERC Discussions, Received from https://www.slideserve.com/seth/introduction-to-flexible-electronics-i, Feb. 24, 2007, 27 pages.
Lindenmann et al., "Connecting Silicon Photonic Circuits to Multicore Fibers by Photonic Wire Bonding," J. Lightwave Technol. 33, 755-760 (2015), Received from https://publikationen.bibliothek.kit.edu/1000049613/3838493, Feb. 15, 2015, 7 pages.
T. Watanabe et al., "Perpendicular Grating Coupler Based on a Blazed Antiback-Reflection Structure," in Journal of Lightwave Technology, vol. 35, No. 21, pp. 4663-4669, Received from https://ieeexplore.ieee.org/stamp/stamp.jsp?tp=&arnumber=8048498, 1 Nov. 1, 2017, doi: 10.1109/JLT.2017.2755673, 7 pages.
J. Peeler, "FAST-ALD for Flexible OLED Displays", Veeco, Received from https://www.sec.gov/Archives/edgar/data/103145/000110465913070920/a13-20974_1ex99d2.htm, Sep. 19, 2013, 22 pages.
J. Peeler, "Q3 2013 Conference Call", Veeco, Received from https://www.sec.gov/Archives/edgar/data/103145/000110465913083116/a13-23867_2ex99d1.htm, Nov. 11, 2013, 40 pages.
Kateeva, "Precision Deposition With Inkjet Printing ", Received from http://kateeva.com/technology/why-inkjet/, 2017, 11 pages.
Conor Madigan,"Inkjet Technology for OLED SSL Mass Production", Kateeva, Received from https://www.energy.gov/sites/prod/files/2015/02/f19/brown-madigan_inkjet_sanfrancisco2015.pdf, Jan. 28, 2015, 24 pages.
Kateeva,"Enabling "Freedom from Glass"", Received from http://kateeva.com/products/yieldjet-flex/, updated 2021 14 pages.
Won Min Yun et al., "Thermally evaporated SiO thin films as a versatile interlayer for plasma-based OLED passivation", Received from https://pubs.acs.org/doi/10.1021/am300600s, ACS Appl. Mater. Interfaces 2012, 4, 6, 3247-3253, May 31, 2012, 2 pages.
TechMetals,"PVD Coating/Thin Film", Received from https://techmetals.com/pvd/, Website updated Jan. 27, 2022, 13 pages.
Wei Chen,"New PVD Systems for Advanced Memory Applications", Applied Materials, Received from https://nccavs-usergroups.avs.org/wp-content/uploads/TFUG2019/November2019/TFUG1119-4-AMAT-Chen.pdf, Nov. 14, 2019, 16 pages.
Hoex, B. et al., "Silicon Surface Passivation by Atomic Layer Deposited Al2O3", Journal of Applied Physics, 104(4), Received from https://pure.tue.nl/ws/files/2990268/Metis218706.pdf, Jan. 1, 2008, 13 pages.
D. Fye, "An Optimization Procedure for the Selection of Diode Laser Facet Coatings," Received from https://ieeexplore.ieee.org/document/1071351/authors#authors, IEEE Journal of Quantum Electronics ( vol. 17, Issue: 9, Sep. 1981), Sep. 1981, 5 pages.
X. Gong et al., "Degradation Analysis of Facet Coating in GaAs-Based High-Power Laser Diodes," Received from https://ieeexplore.ieee.org/document/7128348, IEEE Transactions on Device and Materials Reliability ( vol. 15, Issue: 3, Sep. 2015), Jun. 18, 2015, 4 pages.
Corial, "Advanced Packaging" Received from https://corial.plasmatherm.com/en/markets/advanced-packaging, 2019, 8 pages.

(56) References Cited

OTHER PUBLICATIONS

Mark Taylor, "OLED Encapsulation", Corning, Received from https://www1.eere.energy.gov/buildings/publications/pdfs/ssl/taylor_encapsulation_tampa2014.pdf, Jan. 28, 2014, 10 pages.
Schott, "Bonding the Future", Received from https://www.schott.com/primoceler/hermetic-glass-bonding/, 2020, 10 pages.
Schott, "Applications", Received from https://www.schott.com/primoceler/applications/, 2020, 8 pages.
Lunden et al., "Novel glass welding technique for hermetic encapsulation", Received from https://ieeexplore.ieee.org/document/6962719, Proceedings of the 5th Electronics System—integration Technology Conference (ESTC), Sep. 16-18, 2014, 4 pages.
Lunden et al., "Hermetic and Radiation Tolerant Glass Package for VCSELs Using Novel Micro Bonding Method", Received from https://ieeexplore.ieee.org/document/8951865, 2019 22nd European Microelectronics and Packaging Conference & Exhibition (EMPC), Sep. 16-19, 2019, 5 pages.
Lunden et al., "Room Temperature Bonding for Packaging CMOS Image Sensors; Direct Sapphire Ceramic Sealing", Received from https://ieeexplore.ieee.org/document/7993168, 2017 IMAPS Nordic Conference on Microelectronics Packaging (NordPac), Jun. 18-20, 2017, 4 pages.
Leib et al., "Thin Hermetic Passivation of Semiconductors Using Low Temperature Borosilicate Glass—Benchmark of a New Wafer-Level Packaging Technology", Received from https://ieeexplore.ieee.org/document/5074117, 2009 59th Electronic Components and Technology Conference, May 26-29, 2009, 6 pages.
Juergen Leib et al., "Novel Hermetic Wafer-Level-Packaging Technology using Low-Temperature Passivation", Received from https://ieeexplore.ieee.org/document/1441323?arnumber=1441323, Proceedings Electronic Components and Technology, 2005. ECTC '05., May-Jun. 3, 2005, 4 pages.
Mark Taylor, "Integrated OLED Substrates", Corning, Received from https://www.energy.gov/sites/prod/files/2015/02/f19/chowdhury-taylor_substrates_sanfrancisco2015_0.pdf, Jan. 28, 2015, 10 pages.
Miyamoto, "Welding of Glass/Glass and Si/Glass Using Ultrashort Laser Pulses", Received from https://ieeexplore.ieee.org/document/6801542, 2013 Conference on Lasers & Electro-Optics Europe & International Quantum Electronics Conference CLEO Europe/IQEC, May 12-16, 2013, 1 page.
Unknown, "Thin Film Encapsulation of OLED Displays—A Major Technology Challenge—", Received from http://doc.euflex.com.tw/White_Paper_OLED_Displays_April2014.pdf, Apr. 2014, 5 pages.
PlasmaSi, "PlasmaSi R&D One Quarter G3.5 OptaCap PECVD Deposition Tool An Encapsulation Revolution", Received from http://doc.euflex.com.tw/plasmasi_system_spec.pdf, Mar. 27, 2014, 5 pages.
Euflex, "Aixtron", Received from http://www.euflex.com.tw/en/books/html/?145.html, 2010, 2 pages.
Universal Display Corporation, "UniversalBarrier® Thin-Film Encapsulation", Received from https://oled.com/solutions/oled-technologies/universalbarrier-thin-film-encapsulation/, 2021, 1 page.
Reid Chesterfield et al., "Solution-Coating Technology for AMOLED Displays", Received from https://sid.onlinelibrary.wiley.com/doi/epdf/10.1002/j.2637-496X.2011.tb00339.x, Jan. 2011, 7 pages.
Hitachi, "220-300C low-melting glass for hermetic sealing: Gold-tin solder level temperatures achieved", Retrieved from https://phys.org/news/2012-11-300c-lowmelting-glass-hermetic-gold-tin.html, 2012, Nov. 27, 2 pages.
Kirk T.McDonald, "12.0 Bellows Design", Received from https://hep.princeton.edu//mumu/target/MIT/design/bellows.pdf, Princeton University, Aug. 20, 2004, 8 pages.

* cited by examiner

STRUCTURE AND METHOD FOR SEALING A SILICON IC

BACKGROUND

Field

Embodiments described herein relate to integrated circuit (IC) manufacture, and more particularly to sealing structure designs.

Background Information

Integrated circuit (IC) chips, or dies, are commonly provided with various sealing structures to provide hermetic sealing and crack protection. In one aspect, sealing structure may protect the internal circuits and devices from moisture, oxidation and other contaminants. Several chip materials are porous and amorphous and liable to absorb moisture and contaminants, altering device performance. For example, transistor performance parameters can be changed or degraded by exposure to ionic contamination. In another aspect, sealing structures may protect ICs from cracks which could propagate into the chip active area and cause circuits and devices to fail. Various sources have been observed from which cracks can propagate, such as from the chip silicon substrate, interfaces in multi-layered structures, varying thermo-mechanical properties of multi-layered structures, and high stress processing operations such as dicing and backgrinding.

A current solution for hermetic sealing and crack stops is include a metallic sealing structure, often referred to as a seal ring, within a back-end-of-the-line (BEOL) build up structure formed over the silicon substrate die area. Together, the silicon substrate, seal ring, and a top passivation layer made of a material such as silicon nitride provide a hermetic seal. Impermeable metal contacts can also be formed through the top passivation layer for electrical connection. Commonly, the metallic seal ring will be formed adjacent all sidewalls of the chip. The metal seal ring is typically formed of the same metal layers used form interconnects and vias in the BEOL build-up structure. In addition to providing a sealing structure, the high yield stress of the metal can additionally provide some resistance to crack propagation. Typically, a seal ring will occupy a certain width of the chip area and be spaced apart from the chip edge sidewalls by a certain buffer distance to contain dicing damage.

SUMMARY

Chip sealing structures and methods of manufacture are described. In an embodiment, a chip structure includes a main body area formed of a substrate, a back-end-of-the-line (BEOL) build-up structure spanning over the substrate, and chip edge sidewalls extending from a back surface of the substrate to a top surface of the BEOL build-up structure and laterally surrounding the substrate and the BEOL build-up structure. In accordance with embodiments, conformal sealing layer may cover at least a first chip edge sidewall of the chip edge sidewalls and a portion of the top surface of the BEOL build-up structure, and form a lip around the top surface of the BEOL build-up structure.

The sealing layer may be formed on one or more, or all of the chip edge sidewalls. In an embodiment, the conformal sealing layer applies a compressive stress to the main body area, and may be characterized by a higher coefficient of thermal expansion (CTE) than silicon. The sealing layers may be single, or multiple layers and formed of suitable materials including metallic material layer(s), insulating material layer(s), etc. In an embodiment, the conformal sealing layer does not cover a back surface of the substrate, and may form a planar surface with the back surface of the substrate.

The chip structures in accordance with embodiments can include single die sets or multiple die sets, and may or may not include die-to-die routing between the die sets. Additionally, the chip structures may also include terminal ends of die-to-die routing along the diced chip edge sidewalls.

The chip structures in accordance with embodiments, may be provided without requiring metallic sealing structures (e.g. seal rings) within the BEOL build-up structure, though can optionally be combined with such metallic sealing structures, including full and partial sealing structures.

In an embodiment, a method of sealing a chip includes forming a patterning layer over a BEOL build-up structure formed over a substrate, forming an array of dicing lane grooves though the patterning layer and through at least a portion of the BEOL build-up structure, dicing through the array of dicing lane openings to form an array of kerfs partially through the substrate and define an array of main body areas, depositing a conformal sealing layer over the patterning layer, within the array of kerfs, and partially along a top surface of the BEOL build-up structure, removing the patterning layer along with a portion of the conformal sealing layer on the patterning layer and reducing a thickness of the substrate to open the array of kerfs and singulate a plurality of chips.

In an embodiment, plasma dicing is used to dice through the array of dicing lane openings to form the array of kerfs partially through the BEOL build-up structure and the substrate. In an embodiment, laser dicing is used to form the array of dicing lane grooves.

In an embodiment, openings in the patterning layer that overly the array of kerfs are widened prior to depositing the conformal sealing layer over the patterning layer. For example, this may be done using lithographic techniques, and may negate the need for using multiple patterning layers in the dicing sequence.

DETAILED DESCRIPTION

Figure 1:
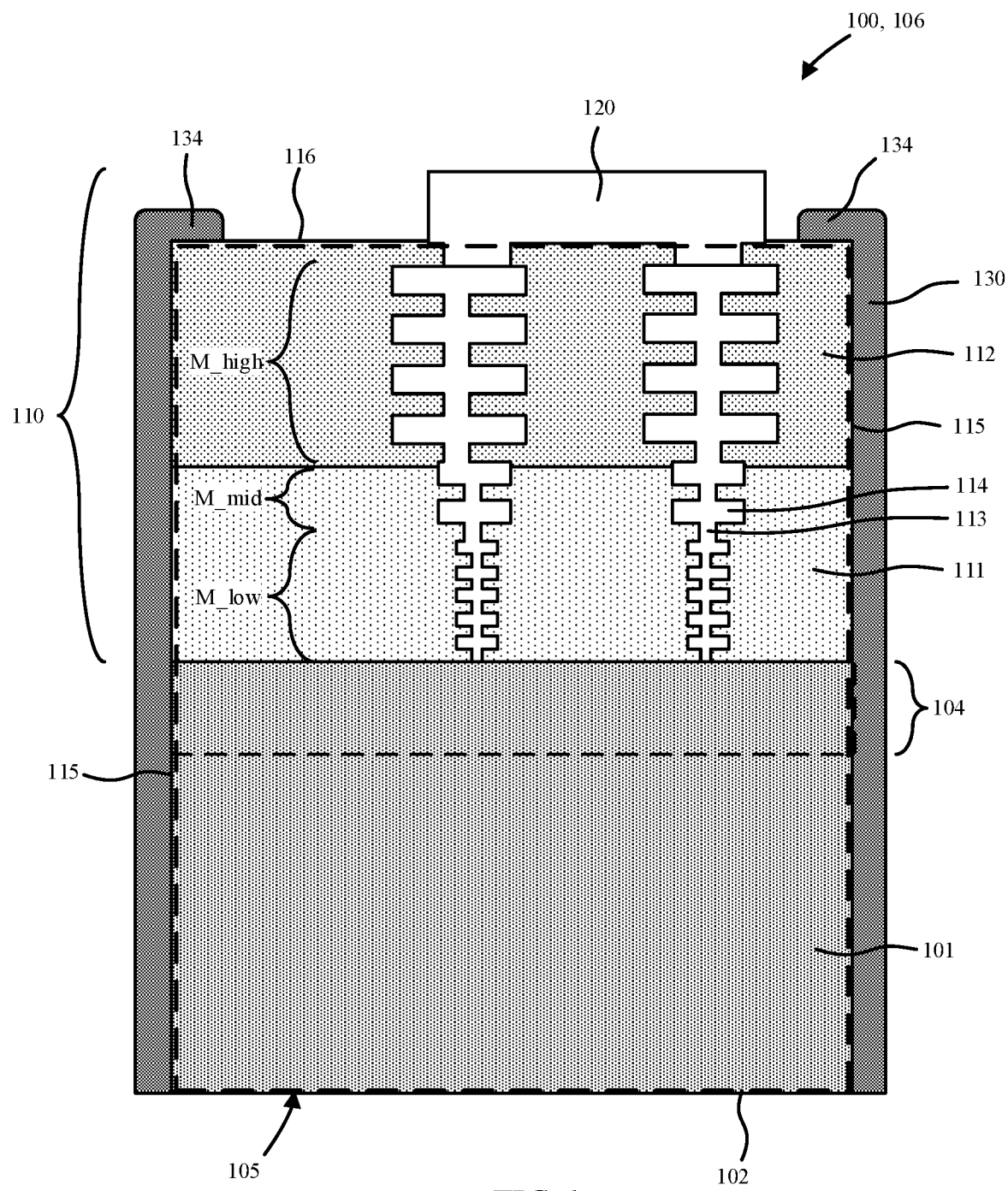
FIG. 1 is a schematic cross-sectional side view illustration of a chip structure including a conformal sealing layer along chip edge sidewalls in accordance with an embodiment.

Embodiments describe chip sealing structures and methods of manufacture. In an embodiment, a chip structure includes a main body area formed of a substrate (e.g. semiconductor substrate) such as silicon, and a back-end-of-the-line (BEOL) build-up structure spanning over the substrate. Chip edge sidewalls extend from a back surface of the substrate to a top surface of the BEOL build-up structure and laterally surround the substrate and the BEOL build-up structure. In accordance with embodiments, a conformal sealing layer covers at least a first chip edge sidewall of the chip edge sidewalls and a portion of the top surface of the BEOL build-up structure to form a lip around the top surface of the BEOL build-up structure.

In one aspect, embodiments describe conformal sealing layers that can be used in combination with or replace traditional seal ring structures. The conformal sealing layers in accordance with embodiments may also provide a clamping force on the multi-layer stack, which can facilitate adhesion and sealing properties of the conformal sealing layer. The conformal sealing layers may additionally create an impermeable membrane.

In another aspect, the conformal sealing layers can improve chip area utilization compared to traditional seal ring structures since area commonly reserved for seal ring physical space is removed. For example, traditional seal ring structures consume a significant die area and overall wafer utilization, particularly for smaller dies. In accordance with embodiment, a sidewall sealing layer allows the reduction of area allocated to the traditional seal ring, thereby increasing the total number of chips that can be harvested per wafer. Additionally, the buffer distance from the chip edge sidewalls can be reduced by replacing high stress-generating mechanical dicing processes such as blade sawing with lower stress processes. In this aspect, embodiments describe programmable dicing techniques. For example, this may include laser assisted chemical etch dicing flows to carve out specific die-set areas, which can also be irregularly shaped. Chemical etching may be wet etch or plasma etch, particularly if the substrate, such as a semiconductor wafer (silicon), is deep (e.g. more than 50 μm). An exemplary plasma dicing process may be, or include, a deep reactive-ion etching (DRIE) process. Such programmable dicing techniques can facilitate harvesting of arrayed structures. Furthermore, such programmable dicing techniques can facilitate dicing through non-conventional FEOL die areas. Furthermore, such dicing techniques can be used to dice BEOL structures with very fragile materials (e.g. dielectrics with low dielectric constants, low-k materials) which could otherwise be damaged by high stress processes. Additionally, the sealing layers described herein can provide added protection against processing stresses as well as sealing in the case the fragile layers are compromised.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or in "contact" with another layer may be directly in contact with the other layer or may have one or more intervening layers. One layer "between" layers may be directly in contact with the layers or may have one or more intervening layers.

Referring now to FIG. 1 a cross-sectional side view illustration is provided of a chip structure 100 in accordance with an embodiment. As shown, the chip structure 100 can include a main body area 105 formed of a multi-layered stack including a substrate 101, a first front-end-of-the line (FEOL) die area 104 of a first die 106 patterned into the substrate 101, a back-end-of-the-line (BEOL) build-up structure 110 spanning over the first FEOL die area 104, and chip edge sidewalls 115 extending from a back surface 102 of the substrate 101 to a top surface 116 of the BEOL build-up structure 110 and laterally surrounding the first FEOL die area 104 and the BEOL build-up structure 110. In accordance with embodiments, a conformal sealing layer 130 covers at least a first chip edge sidewall of the chip edge sidewalls 115 and a portion of the top surface 116 of the BEOL build-up structure 110 such that the conformal sealing layer 130 forms a lip 134 around the top surface 116 of the BEOL build-up structure 110.

In accordance with some embodiments, the conformal sealing layer 130 material(s) may be selected to form a compressive stress to the main body area 105. This can be vertical stress and/or horizontal stress. The compressive stress can help clamp the conformal sealing layer 130 onto the main body area and promote adhesion. Compressive stress may provide additional protection from mechanical stressors such as cracks. The conformal sealing layer 130 may have a sufficiently high Young's modulus, yield stress, and fracture toughness to protect against mechanical stressors. In an embodiment, the substrate 101 is a silicon substrate or silicon on insulator (SOI) substrate. The conformal sealing layer 130 may possesses strong adhesion to silicon, and not diffuse substantially into silicon to adversely affect device performance. In an embodiment, the conformal sealing layer 130 has a Young's Modulus greater than silicon such as greater than 170 GPa, or more specifically 300-550 GPa, such as 300-400 GPa, and a coefficient of thermal expansion (CTE) greater than the substrate (e.g. silicon), such as greater than 4 ppm/° C. Compressive stress can also be tailored by deposition parameters. For example, this may be facilitated by a high temperature deposition process in which the deposited material contracts upon cooling, providing compressive stress. In some embodiments, the conformal sealing layer 130 may be slightly tensile, and still function as an impermeable barrier.

The FEOL die areas 104 in accordance with embodiments can include the active and passive devices of the dies 106. The BEOL build-up structure 110 is then formed over the substrate 101 to provide electrical interconnections. The BEOL build-up structure 110 may conventionally fulfill the connectivity requirements of the die 106. The BEOL build-up structure 110 may be fabricated using conventional materials including metallic wiring layers 114 and vias 113 (e.g. copper, aluminum, etc.) and insulating interlayer dielectrics (ILD) 111, 112 such as oxides (e.g. silicon oxide, carbon doped oxides, etc.), nitrides (e.g. silicon nitride), low-k, materials, etc. The BEOL build-up structure 110 wiring layers 114 can be formed in lower metal layers M_low, upper metal layers M_high, and midlevel metal layers M_mid. The upper metal layers M_high may have coarser line widths and line spacing, with the midlevel metal layers M_mid having intermediate line widths and spacing, and the lower metal layers M_low having finer line widths and spacing. Additionally, the interlayer dielectrics (ILDs) 111 for the lower metal and midlevel metal layers may be formed of low_k materials, which can allow quicker moisture transport. Thus, when using the finer wiring layers, additional precautions can be taken in accordance with embodiments, such as passivation of diced chip edge sidewalls 115 with conformal sealing layer 130. The top surface of the BEOL build-up structure 110 can include exposed contact pads 120, such as underbump metallurgy (UBM) pads, and may be connected to the FEOL die areas 104.

Up until this point, the description related to FIG. 1 has focused on a chip structure 100 including a single FEOL die area 104 of a single die 106. However, embodiments are not so limited and may include multiple dies 106 and corresponding FEOL die areas 104, which can be connected with die-to-die routing within the BEOL build-up structure 110. Additionally, other structures such as metallic sealing structures (e.g. full or partial seal rings) can optionally be included within the BEOL build-up structure 110. Furthermore, the conformal sealing layer 130 may be formed on any number of chip edge sidewalls 115 ranging from selective deposition onto a single chip edge sidewall 115 or all chip edge sidewalls 115. Deposition onto multiple chip edge sidewalls 115 may further facilitate clamping in the x-y plane (e.g. lateral, horizontal), with the lip 134 further facilitating clamping in the z-direction (e.g. vertical, along dicing direction).

Figure 2A:
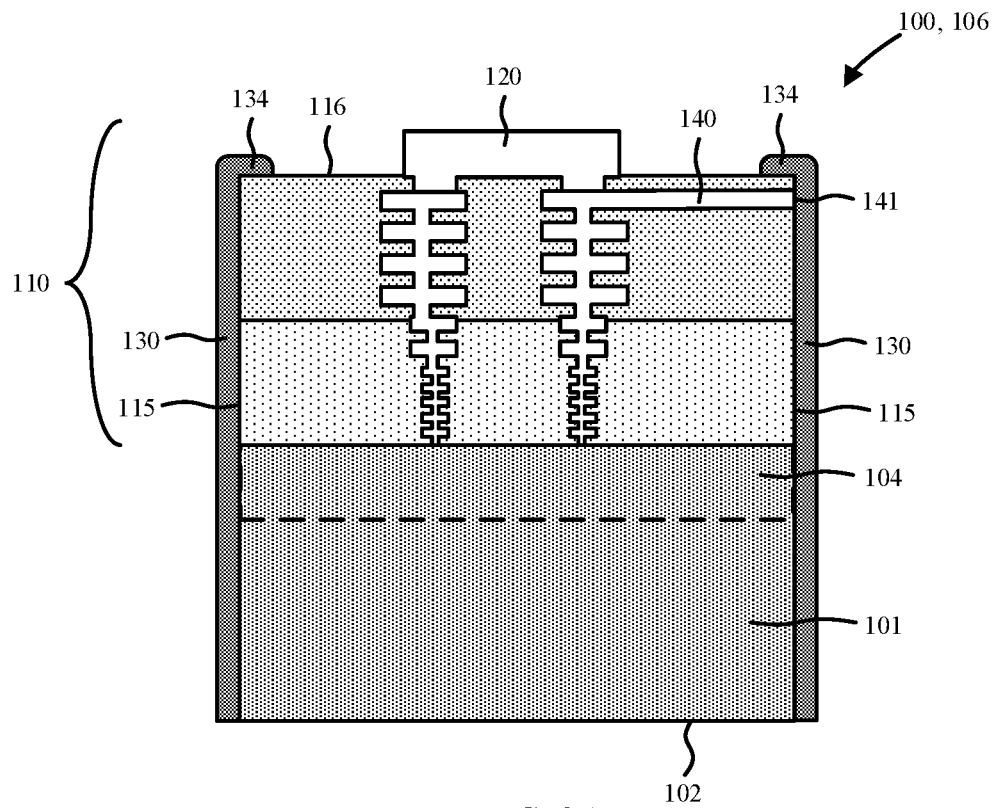
FIG. 2A is a schematic cross-sectional side view illustration of a chip structure including a conformal sealing layer along chip edge sidewalls including diced die-to-die routing in accordance with an embodiment.
Figure 2B:
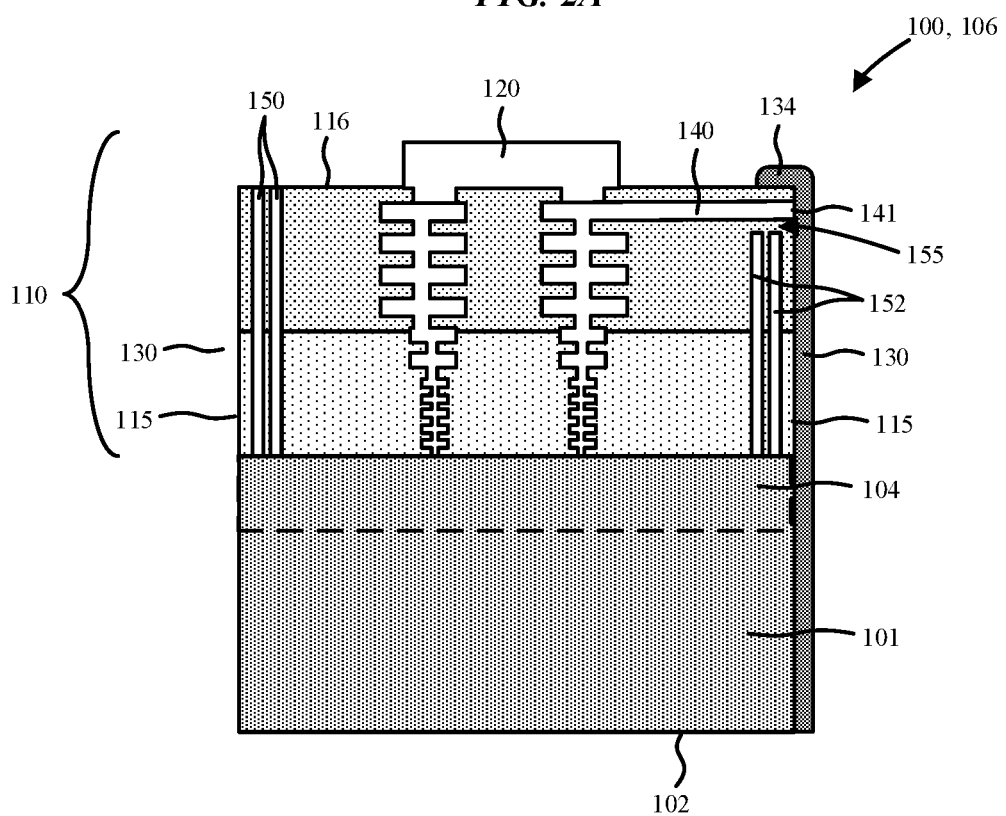
FIG. 2B is a schematic cross-sectional side view illustration of a chip structure including a metallic sealing structure and conformal sealing layer along a chip edge sidewall including diced die-to-die routing in accordance with an embodiment.

Referring now to FIGS. 2A-2B additional illustrations are provided of chip structures 100 with additional features. While illustrated and described separately, the additional features are not necessarily intended to be exclusive of one another, and instead are intended to illustrate flexibility for application of the conformal sealing layer 130 in accordance with embodiments.

FIG. 2A is a schematic cross-sectional side view illustration of a chip structure 100 including a conformal sealing layer 130 along chip edge sidewalls 115 similar to that illustrated and described with regard to FIG. 1 with the additional feature of diced die-to-die routing 140 in accordance with an embodiment. As shown a terminal end 141 of the die-to-die routing 140 may be exposed along the chip edge sidewall 115, with the conformal sealing layer 130 being deposited directly on the terminal end 141. In the embodiment illustrated, the upper metal layers M_high may be primarily used for die-to-die routing 140 for lower resistance wiring, and possibly greater flexibility to form chip structures 100 including custom die sets with dynamic die-to-die routing 140 after testing. While the chip structure 100 of FIG. 2A includes a single FEOL die area 104, with scribed die-to-die routing 140, the chip structures 100 in accordance with embodiments may include a plurality of FEOL die areas 104 corresponding to separate dies 106 connected with die-to-die routing 140. Thus, illustration and description of FIG. 2A is not intended to be limited to the specific structure illustrated, and instead is intended to illustrate a chip structure 100 including a conformal sealing layer 130 deposited along a diced chip edge sidewall 115 including a diced die-to-die routing 140.

Referring now to FIG. 2B, a schematic cross-sectional side view illustration is provided of a chip structure 100 including a metallic sealing structure and conformal sealing layer 130 along a chip edge sidewall 115 including diced die-to-die routing 140 in accordance with an embodiment. Specifically, FIG. 2B illustrates a combination of a partial metallic sealing structure 152 adjacent a first chip edge sidewall 115 and a full metallic sealing structure 150 adjacent a second chip edge sidewall 115. Full metallic sealing structures 150 may extend substantially through the BEOL build-up structure from underlying silicon substrate 101 to upper metal layers M_high and in contact with the top passivation layer to provide an impermeable seal. Partial metallic sealing structures 150 may include one or more openings within the dielectric layers 111, 112 of the BEOL build-up structure 110.

In the illustrated embodiments, the die-to-die routing 140 extends through an opening 155 vertically oriented with the partial metallic sealing structure 152. Specifically, the opening 155 is illustrated as being above with partial metallic sealing structure 152, though the opening 155 could also be under, or within the partial metallic sealing structure 152. In accordance with embodiments, the die-to-die routing 140 can extend through multiple openings 155 within the metallic sealing structure 152.

Still referring to FIG. 2B, some additional optional features are illustrated to show flexibility of the sealing structure designs in accordance with embodiments. For example, where a full sealing structure 150 is provided adjacent a chip edge sidewall 115, the conformal sealing layer 130 is optionally not deposited. In the illustrated embodiment, the conformal sealing layer 130 is selectively deposited along the compromised chip edge sidewall 115 including the partial metallic sealing structure 152. It is to be appreciated that such an embodiment is exemplary, and embodiments are not so limited.

Up until this point, the description and illustrations with regard to FIGS. 1-2B has been primarily directed to chip structures 100 including one or more dies 106. For example, each die 106 may include a die area 104 formed within the substrate 101, and overlying BEOL build-up structure. The die area 104 may include one or more active devices (e.g. transistors for logic function) or passive devices (e.g. capacitors, inductors, resistors, etc.). Accordingly, the term "die" or "die area" as used herein can be inclusive of both active devices and passive devices. Exemplary dies 106 can include logic, memory, and may combine multiple intellectual property (IP) cores, or single IP cores. For example, the dies 106 can be system on chip (SOC) dies including multiple IP cores, or smaller chiplets of including one or more partitioned IP cores. In an embodiment, the dies 106 include arrays of passive devices, such as capacitor arrays, for connection with other electronic components. In an embodiment, the chip structures 100 described herein do not include a die, and instead can provide discrete routing and/or devices. For example, the chip structures 100 can be an interfacing bar, or bridge for connecting multiple components.

Figure 3A:
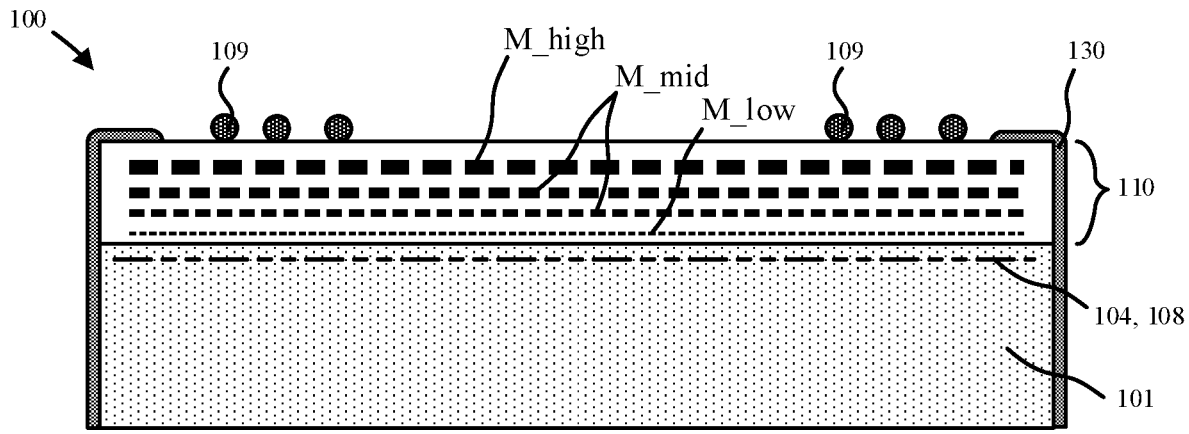
FIG. 3A is a schematic cross-sectional side view illustration of a chip structure including a BEOL build-up structure spanning over a single FEOL die area in accordance with an embodiment.

Referring now to FIG. 3A a schematic cross-sectional side view illustration is provided of a chip structure 100 including a BEOL build-up structure 110 spanning over a single FEOL die area 104 in accordance with an embodiment. The single FEOL die area 104 may include multiple devices 108, such as active device or passive devices. In an embodiment, a plurality of solder bumps 109 can be provided on the BEOL build-up structure 110, for example onto contact pads 120, for flip chip connection. However, this is exemplary and embodiments are not so limited.

Figure 3B:
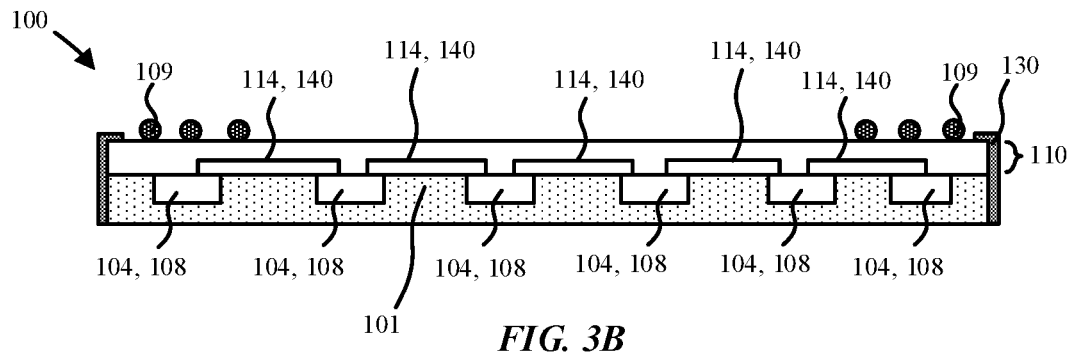
FIG. 3B is a schematic cross-sectional side view illustration of a chip structure including a BEOL build-up structure spanning over multiple FEOL die areas in accordance with an embodiment.
Figure 3C:
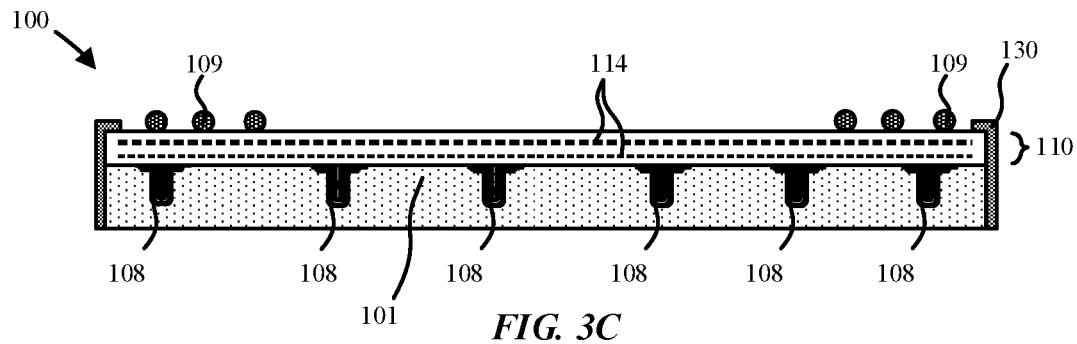
FIG. 3C is a schematic cross-sectional side view illustration of a chip structure including a BEOL build-up structure spanning over a plurality of devices formed with the substrate in accordance with an embodiment.
Figure 3D:
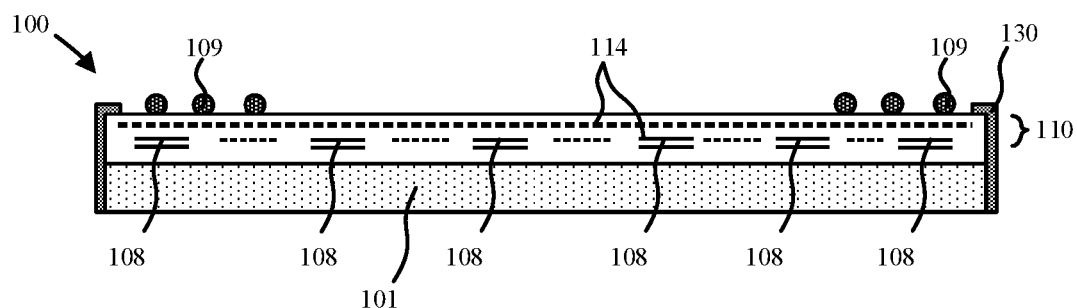
FIG. 3D is a schematic cross-sectional side view illustration of a chip structure including a BEOL build-up structure that includes a plurality of devices substrate in accordance with an embodiment.

FIG. 3B is similar to the chip structure 100 of FIG. 3A, with the inclusion of multiple die areas 104, which can be connected by die-to-die routing 140 in the BEOL build-up structure 110. Referring now to FIG. 3C, a variation of FIGS. 3A-3B is illustrated in which the BEOL build-up structure 110 spans over a plurality of devices 108 formed in the substrate 101. FIG. 3C is merely an alternate illustration of either FIG. 3A or FIG. 3B, where the plurality of devices 108 can be considered to be in the same die area 104, or different die areas 104. Thus, FIG. 3C illustrates an exemplary embodiment such as an integrated passive device, where a plurality of devices 108 such as trench capacitors can be provided in a chiplet structure to be connected with another component. Referring now to FIG. 3D an alternative embodiment is illustrated where the devices 108 are optionally formed within the BEOL build-up structure 110 rather than in the underlying substrate 101. In such an embodiment, the chip structure 100 may be an interfacing bar, or bridge, including wiring layers 114, and optionally one or more devices 108. In an embodiment, the chip structure 100 does not include a die area 104. It is to be appreciated that the chip structures 100 illustrated in FIGS. 3A-3D can be combined. For example, devices 108 can be formed in both the substrate 101 and BEOL build-up structure 100, that may span over one or more die areas.

Figure 4:
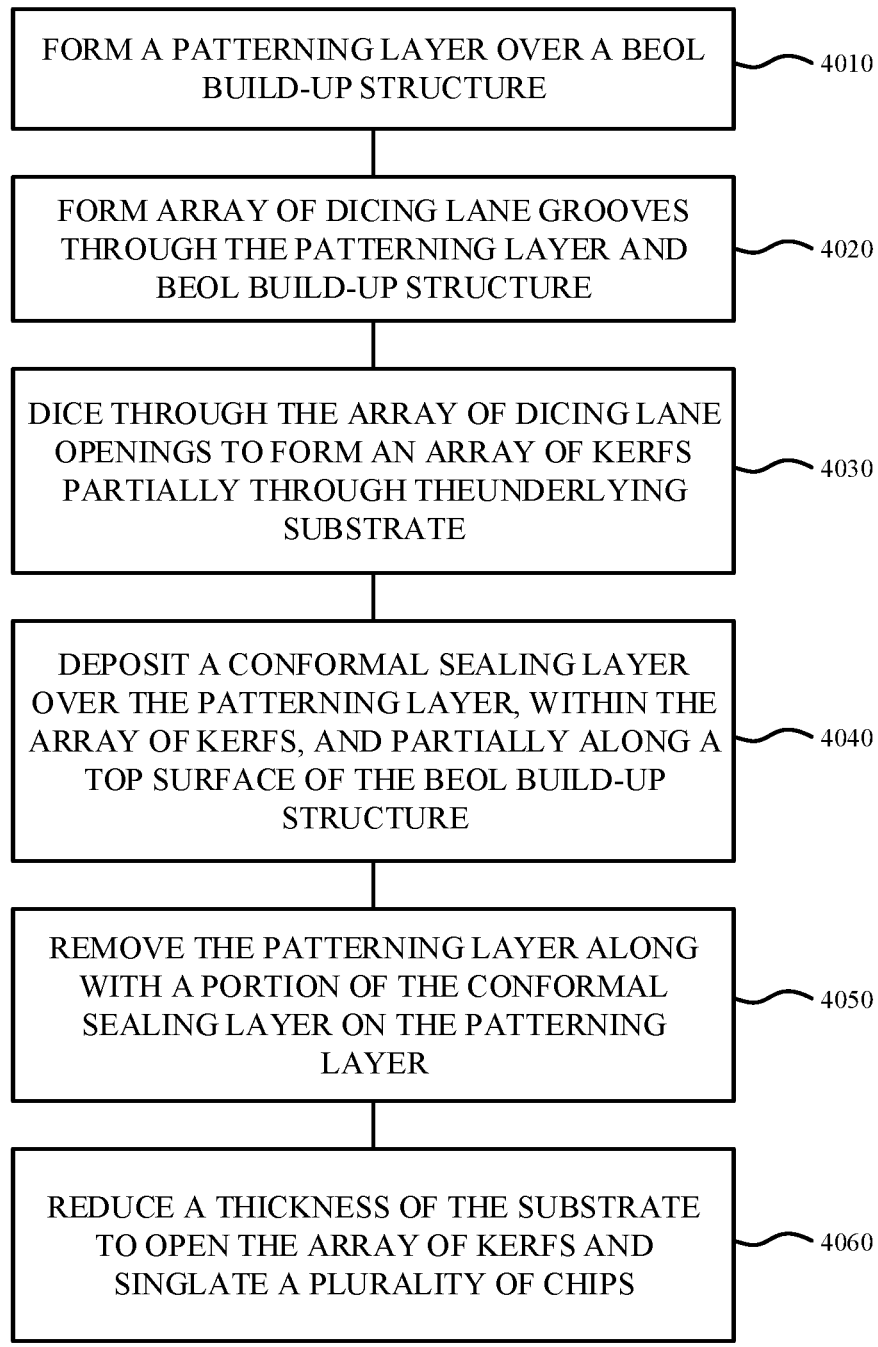
FIG. 4 is a flow chart illustrating a process for forming a plurality of chip structures including a conformal sealing layer in accordance with an embodiment.

Turning now to FIG. 4 and FIGS. 5A-5G a flow chart and schematic cross-sectional side view illustrations are provided for a process of forming a plurality of chip structures including a conformal sealing layer in accordance with an embodiment. In interest of clarity and conciseness, the flow chart provide in FIG. 4 is described concurrently with the illustrations in FIGS. 5A-5G. Furthermore, while the exemplary process flow illustrates the formation of a plurality of chip structures 100, each including a single FEOL die area 104, that the embodiments are not so limited and may include multi-die set chip structures 100 with multiple FEOL die areas 104, or any of the alternative chip structures described herein.

In accordance with embodiments, the combination of laser dicing and chemical etch dicing, such as plasma dicing, can be used to provide custom harvesting of various arrayed. Such programmable dicing techniques can also be employed to provide additional flexibility into selection of dicing areas, and to support fine dicing with reduced street width or loss of material. In operation, an arrayed wafer including FEOL die areas 104 and BEOL build-up structure 110 with complete die-to-die routing can be received and tested for good and bad FOEL die areas 104. This information is then used to create a map identifying valid die 106 sets for chip structures 100.

Figure 5A:
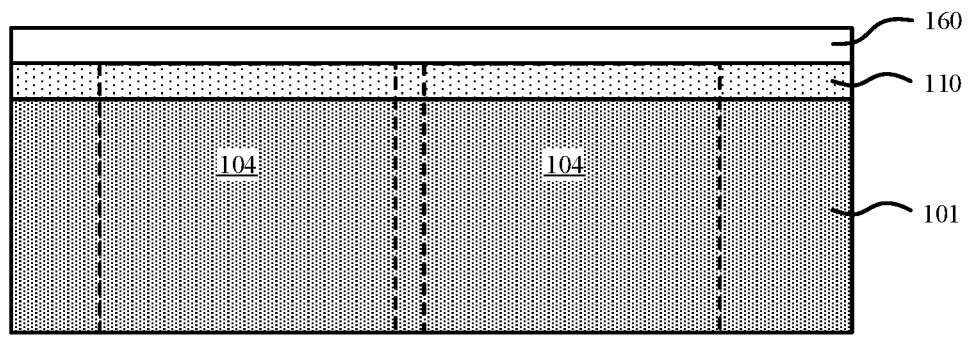
FIGS. 5A-5G are schematic cross-sectional side view illustrations of a process flow for forming a plurality of chip structures including a conformal sealing layer in accordance with an embodiment.
Figure 5B:
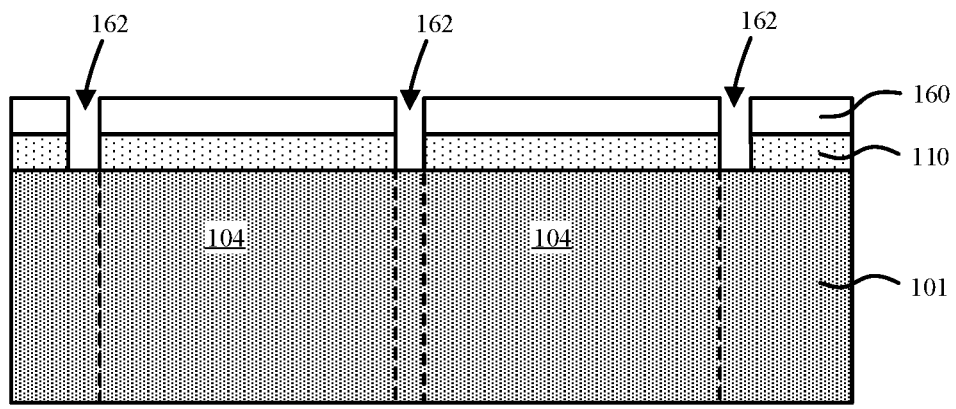
Figure 5C:
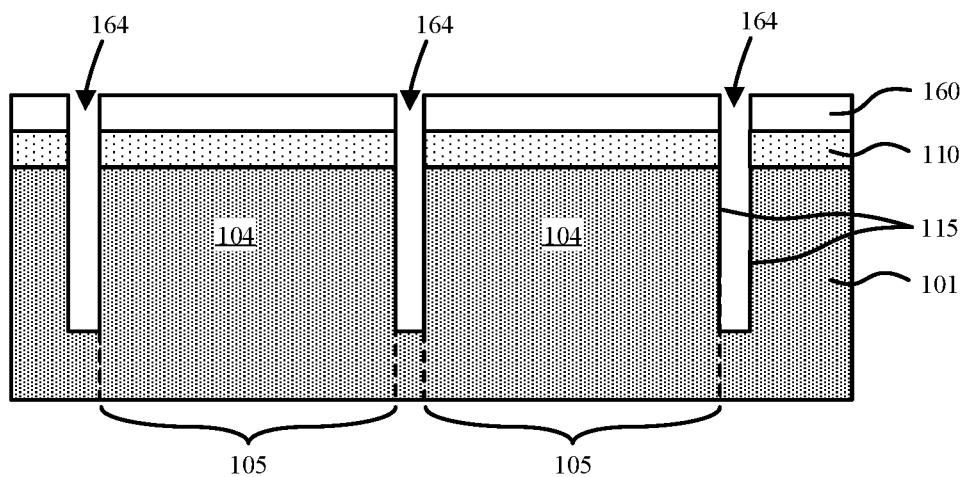

At operation 4010 a patterning layer, such as a lift-off photoresist or other masking material, is formed over the BEOL build-up structure of a fully built wafer as shown in FIG. 5A using a suitable method such as spin coating. A dicing tool then retrieves the map and can perform programmable dicing. At operation 4020 the dicing tool may first form an array of dicing lane grooves 162 through the patterning layer 160 and the BEOL build-up structure 110 as shown in FIG. 5B. The dicing lane grooves 162 may be formed partially or completely through the BEOL build-up structure 110 to expose the substrate 101. Thus, this laser dicing operation may also cut through any die-to-die routing 140 that may be present in the dicing lanes. Laser cutting through the patterning layer 160 and BEOL build-up structure 110 may avoid an additional lithography operation, and can be well defined (e.g. <1 μm edge). At operation 4030 dicing is then performed through the array of dicing lane openings to form an array of kerfs 164 partially through the underlying substrate 101 as shown in FIG. 5C. In accordance with embodiments, this operation may be a chemical etch dicing operation such as plasma dicing or wet chemical dicing, using the patterning layer 160 as an etch mask. The chemical etch dicing operation may additionally define a plurality of main body areas 105 in the multi-layer stack-up, including what will become the chip edge sidewalls 115. Such programmable dicing techniques as described with operations 4020-4030 can be used to achieve fine dicing, with mitigated material loss. This facilitates integration of dense arrayed structures. Additionally, the programmable dicing techniques are very flexible for shape, size or layout constraints. This allows the freedom to dice chip structures with die sets of any shape. This ability thus allows additional reliability margin improvements to the diced die sets to be realized with programmable dicing in accordance with embodiments.

Figure 5D:
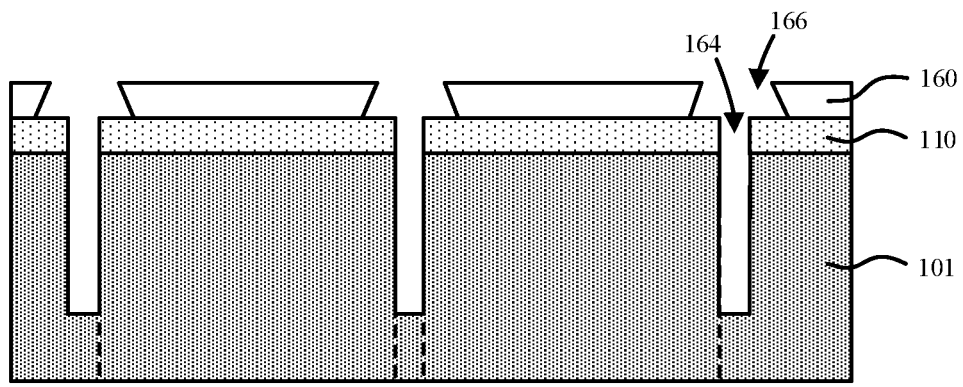
Figure 5E:
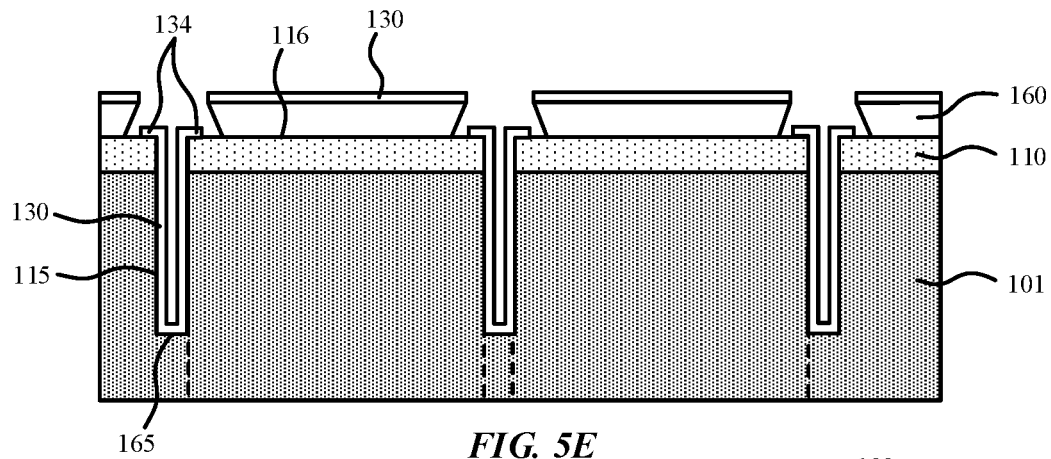

Referring now to FIG. 5D openings 166 in the patterning layer 160 that overlie the array kerfs 164 are widened. For example, the openings previously corresponding to formation of the dicing lane grooves 162 and subsequent kerfs 164 are further widened within the patterning layer 160. This may correspond to a resist pull-back operation in which lithography is used to pattern the opening 166. This is followed with operation 4040 in which a conformal sealing layer 130 is deposited over the patterning layer 160, within the array of kerfs 164, and partially along the top surface 116 of the BEOL build-up structure 110 to form lips 134. As shown, the conformal sealing layer 130 is deposited along the chip edge sidewalls 115 and bottom surface 165 of the kerfs 164 within the substrate 101. In accordance with embodiments, the conformal sealing layer 130 may be a single layer or include multiple layers.

The conformal sealing layer 130 may be formed of a variety of materials, or layer stacks of different materials, including semiconductors, metals, semi-metals, dielectrics, ceramics, and polymers. Selection of material may be based on at least barrier properties, clamping action, and diffusivity into the substrate, with higher Young's Modulus and CTE tending to provide higher clamping action. A listing of exemplary materials is provided in Table 1.

which the deposited material contracts upon cooling, providing compressive stress. The conformal sealing layer 130 may be formed of suitable materials, including oxides (e.g. alumina), nitrides (e.g. silicon nitride, titanium nitride, titanium carbonitride, chromium nitride, aluminum titanium nitride, aluminum titanium chromium nitride, zirconium nitride), metals, and metal oxides. Suitable deposition methods include, but are not limited to, chemical vapor deposition (CVD), plasma enhanced chemical vapor deposition (PECVD), atomic layer deposition (ALD), and physical vapor deposition (PVD). In an embodiment, the conformal sealing layer 130 has a Young's Modulus greater than silicon such as greater than 170 GPa, or more specifically 300-400 GPa, and a coefficient of thermal expansion (CTE) greater than silicon, such as greater than 4 ppm/° C.

Figure 5F:
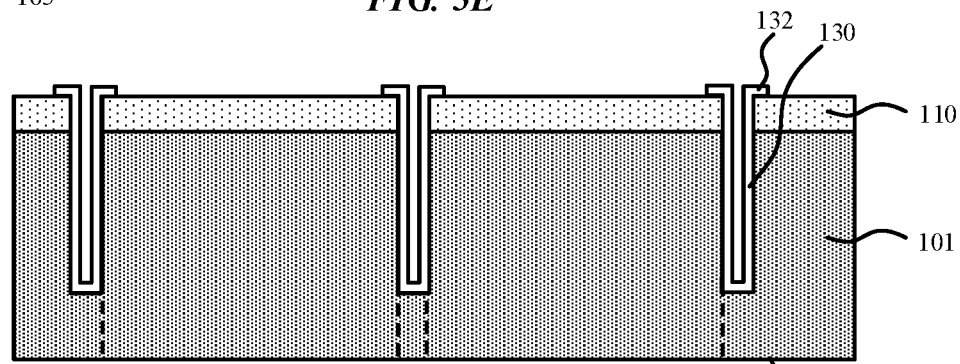
Figure 5G:
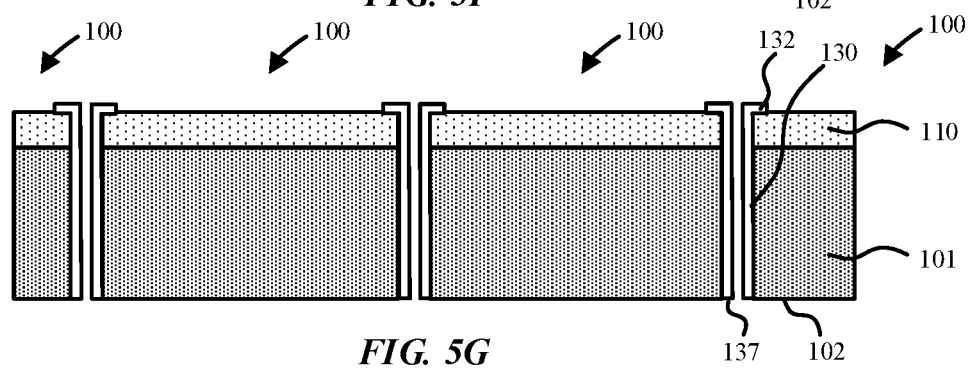

Following deposition of the conformal sealing layer 130, the patterning layer 160 may then be removed along with a portion of the conformal sealing layer 130 on top of the patterning layer 160 at operation 4050, and as shown in FIG. 5F. The multi-layer stack may then be flipped over, and a thickness of the substrate 101 is reduced to open up the array of kerfs 164 at operation 4060, which also has the effect of singulating the plurality of chip structures 100 as shown in FIG. 5G. The reduction in thickness can be performed chemically, or through a backgrinding operation such as chemical mechanical polishing (CMP) where the depth of the back surface 102 is reduced past the bottom surfaces 165 of the kerfs 164. As a result, the back surfaces 102 of the substrate 101 may form a planar surface with back surfaces 137 of the conformal sealing layer 130.

Figure 6:
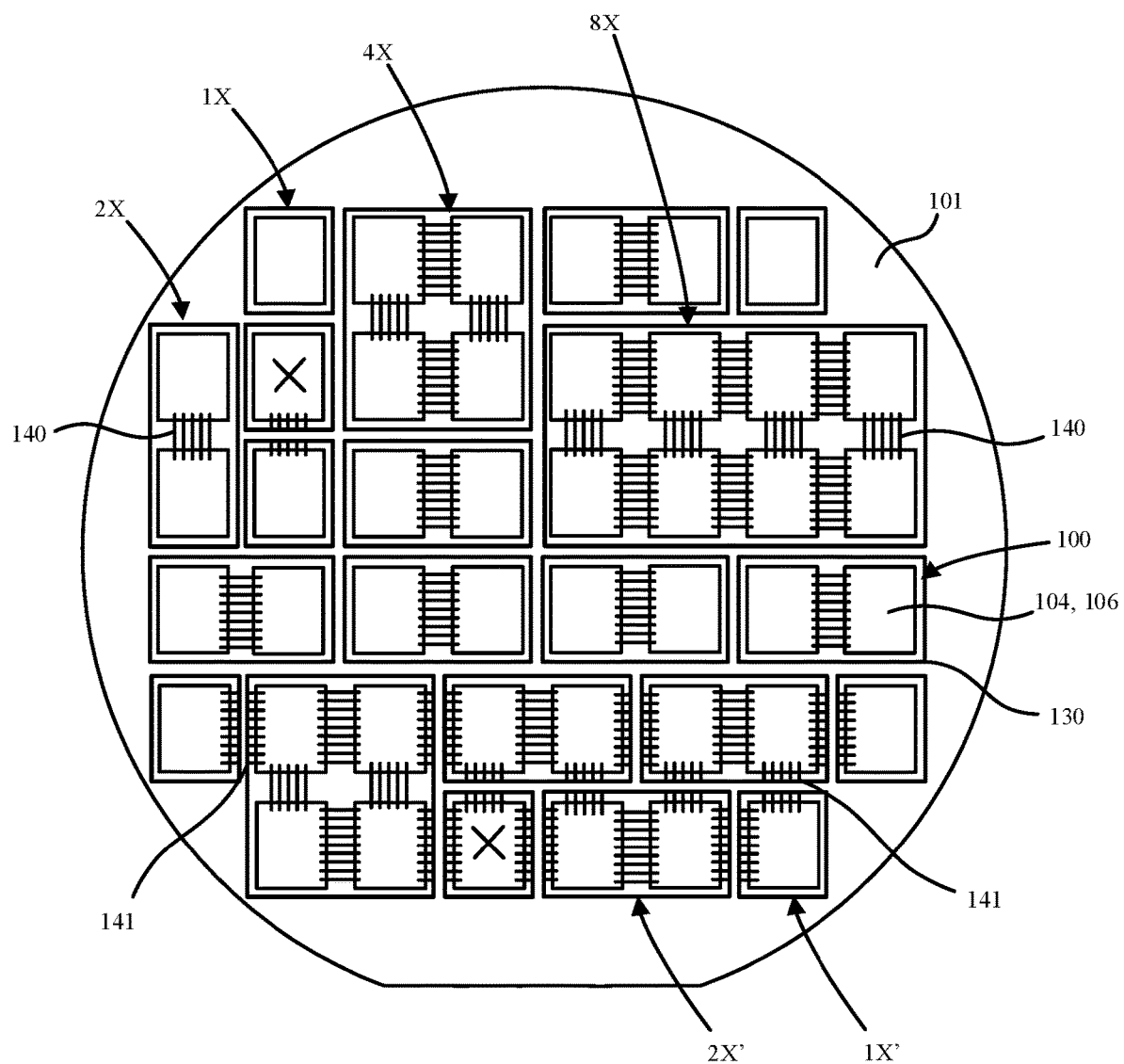
FIG. 6 is a schematic top view illustration of a wafer including a plurality of various die sets of different sizes in accordance with an embodiment.

Referring now to FIG. 6, a schematic top view illustration is provided of a wafer (substrate 101) including a plurality

TABLE 1

Listing of conformal sealing layer exemplary materials

| Material Class | Material | Young's Modulus (GPa) | CTE (ppm/° C.) | Barrier properties | Clamping action | Diffusivity risk in silicon | Comment |
| --- | --- | --- | --- | --- | --- | --- | --- |
| Semi-conductors | Si | 170 | 3 | | | | |
| Metals/Semi-metals | TiN | 500 | 9 | Good | Good | Low | Film may apply bidirectional compressive stress |
| | Ti | 120 | 9 | Good, also a getter for oxidation and moisture | Good | High | Silicide formation with Si may help adhesion |
| | Cu | 130 | 17 | Good | Good | High | |
| Dielectrics | SiO2 (Glass) | 80 | 0.5 | Moderate | Moderate | Low | SiO2 is weaker and may be under tensile stress |
| | Si—O—C—N alloys | ~100 | ~3 | Moderate+ | Moderate+ | Low | Better than SiO2 |
| Ceramics | SiN | 350 | 1 | Good | Moderate+ | Low | |
| | Al2O3 | 450 | 4.5 | Good | Good | Low | |
| Polymers | Polyimide | 2.5 | 50 | Moderate | Moderate | Low | |

In accordance with embodiments, the conformal sealing layer 130 may exert a compressive stress on the main body areas 105. This can be vertical stress and/or horizontal stress in the vicinity of the sealing layer. The compressive stress can help clamp the conformal sealing layer 130 onto the main body area and promote adhesion. The vertical stress can also help hold the stack together. For example, this may be facilitated by a high temperature deposition process in of various FEOL die areas 104 arranged in die 106 sets of different sizes in accordance with an embodiment. Specifically, FIG. 6 illustrates an exemplary stage in processing similar to FIG. 5F, after deposition of a conformal sealing layer 130 and prior to backgrinding to singulate each chip structure 100. It is to be appreciated that the illustration provided in FIG. 6 however shows conformal sealing layer 130 outlines, generally as they may appear after singulation in order to show dicing lanes between chip structures 100.

As shown, adjacent FEOL die areas 104 can be interconnected with die-to-die routing 140 to form chip structures 100 with any number of die sets. Specifically illustrated are die sets of 1X, 2X, 4X, 8X. Each FEOL die area 104 may have a distinct circuit block separate from adjacent die areas 104. Each FEOL die area 104 may represent a complete system, or sub-system. Adjacent FEOL die areas 104 may perform the same or different function. In an embodiment, an FEOL die area 104 interconnected with die-to-die routing can include a digital die area tied to an FEOL die area 104 with another function, such as analog, wireless (e.g. radio frequency, RF) or wireless input/output, by way of non-limiting examples. The tied FEOL die areas 104 may be formed using the same processing nodes, whether or not having the same or different functions. Whether each FEOL die area 104 includes a complete system, or are tied sub-systems, the die-to-die routing 140 may be inter-die routing (different systems) or intra-die routing (different, or same subsystems within the same system). For example, intra die-to-die routing may connect different subsystems within a system on chip (SOC) where inter die-to-die routing can connect different SOCs, though this is illustrative and embodiments are not limited to SOCs.

In accordance with embodiments, any or all FEOL die area 104 edges can be configured to include die-to-die routing 140. As shown in FIG. 6, dicing or scribe lanes can be located anywhere to accommodate yield (e.g. bad dies) or demand (e.g. need for larger die sets. Dicing can be performed through die-to-die routing 140 between FEOL die areas 104, or not. For example, the top five rows on substrate 101 are illustrated as having selective conformal sealing layers 130 deposited around pre-determined chip structure 100 die sets. The specific die 106 sets could have been determined after initial die area testing prior to completing the die-to-die routing 140, or after completion of the BEOL build-up structures including die-to-die routing 140. A defective FEOL die area, marked with an "X," may cause dicing to be performed through die-to-die routing 140 which would have otherwise connected adjacent die areas 104 within a chip structure 110. The bottom two rows show a slightly different configuration, where die-to-die routing 140 connects all FEOL die areas 104 in the bottom two rows, and die set determination is made after formation of the die-to-die routing. In this configuration, dicing lanes will go through die-to-die routing 140. The harvesting and chip sealing techniques in accordance with embodiments can facilitate improved wafer utilization and harvesting of more dies or components. For example, this may be accomplished by being able to harvest die sets of different or irregular shapes, as well as utilizing programmable dicing methods.

In order to illustrate flexibility of the conformal sealing layer 130 and programmable dicing methods, various exemplary implementations are described and illustrated with regard to FIGS. 7-18. It is to be appreciated that the following examples are illustrative of different features, and are not necessarily restrictive of one another, and may be combined in various single and multiple die set arrangements. Similar to FIG. 6, FIGS. 7-18 illustrate exemplary embodiments after deposition of a conformal sealing layer 130, and prior to backgrinding.

Figure 7:
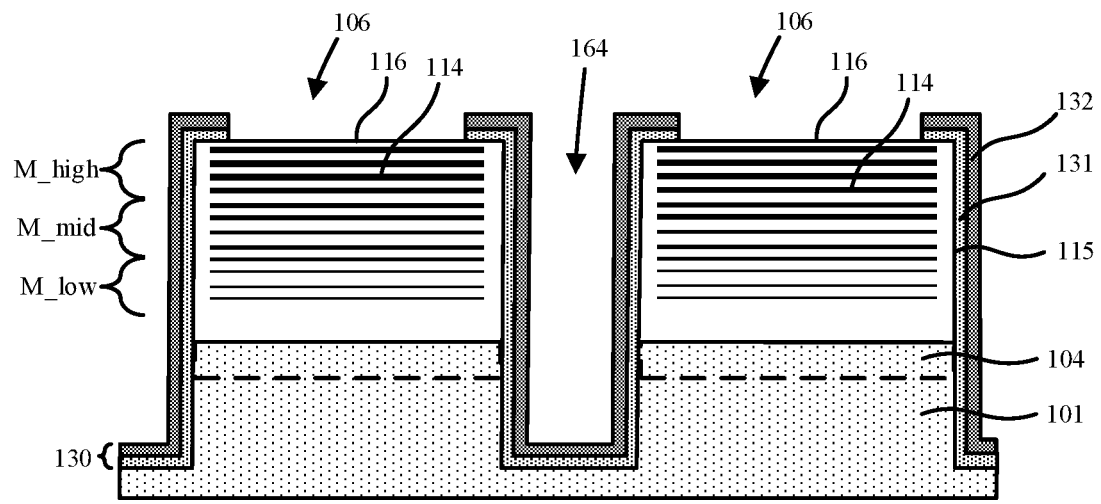
FIG. 7 is a schematic cross-sectional side view illustration of a conformal sealing layer formed around individual dies in accordance with an embodiment.
Figure 8:
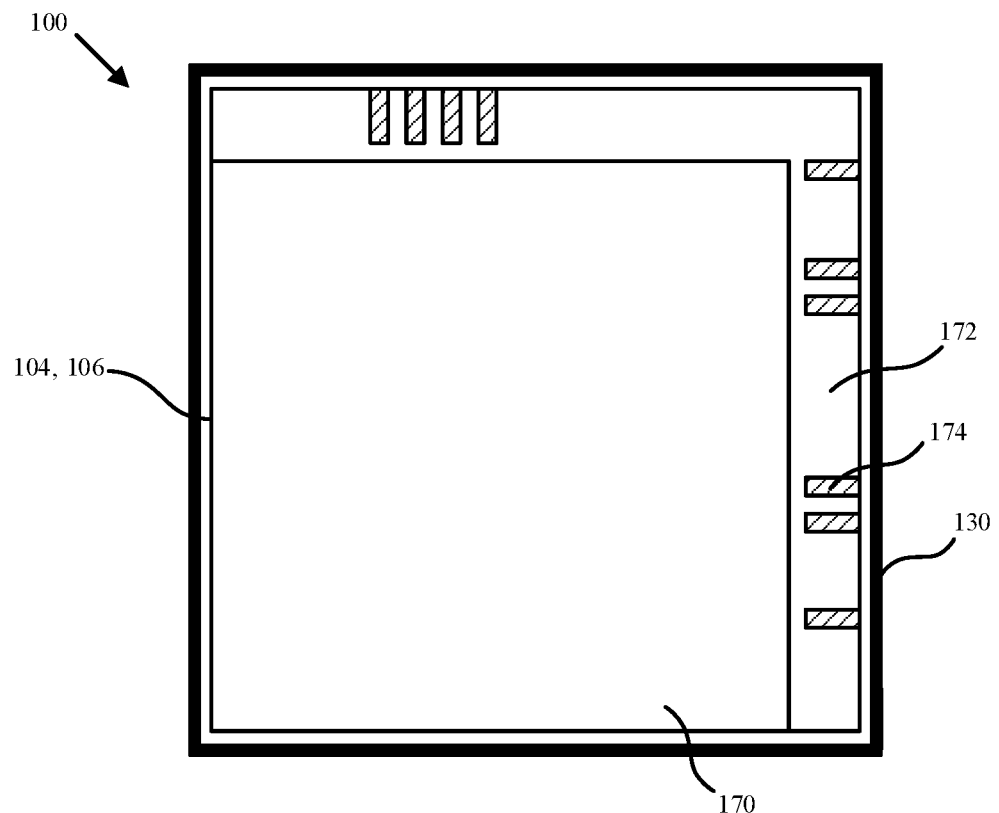
FIG. 8 is a schematic top view illustration of a conformal sealing layer formed around an individual die in accordance with an embodiment.

Referring to FIGS. 7-8, FIG. 7 is a schematic cross-sectional side view illustration of a conformal sealing layer 130 formed around individual dies 106 in accordance with an embodiment. FIG. 8 is a schematic top view illustration of a conformal sealing layer formed around an individual die 106 in accordance with an embodiment. Thus, the embodiments illustrated in FIGS. 7-8 may correspond to sealing of a chip structure 100 including a 1X die set of FIG. 6. More specifically, the cross-sectional side view illustration of FIG. 7 illustrates various wiring layers M_low, M_mid, M_high, optionally a multiple layer conformal sealing layer 130 including a first seal layer 131 formed along chip edge sidewalls 115 and top surface 116 of the BEOL build-up structure 110, and second seal layer 132 formed on the first seal layer 131. In the exemplary top view illustration of FIG. 8, the chip structure 100 includes a FEOL die area 104 that includes both a device area 170 and input output/region(s) 172. In an exemplary implementation, die routing 174 within the BEOL build-up structure 110 may be connected to the input/output region(s) 172 for potential connection to die-to-die routing. For example, the die routing 174 may be included within one of the upper metal layers, M_high, and connected to the FEOL die area 104 with various wiring layers 114 and vias 113 (see FIG. 1). In the exemplary embodiment illustrated, the chip structure 100 does not include die-to-die routing.

Figure 9:
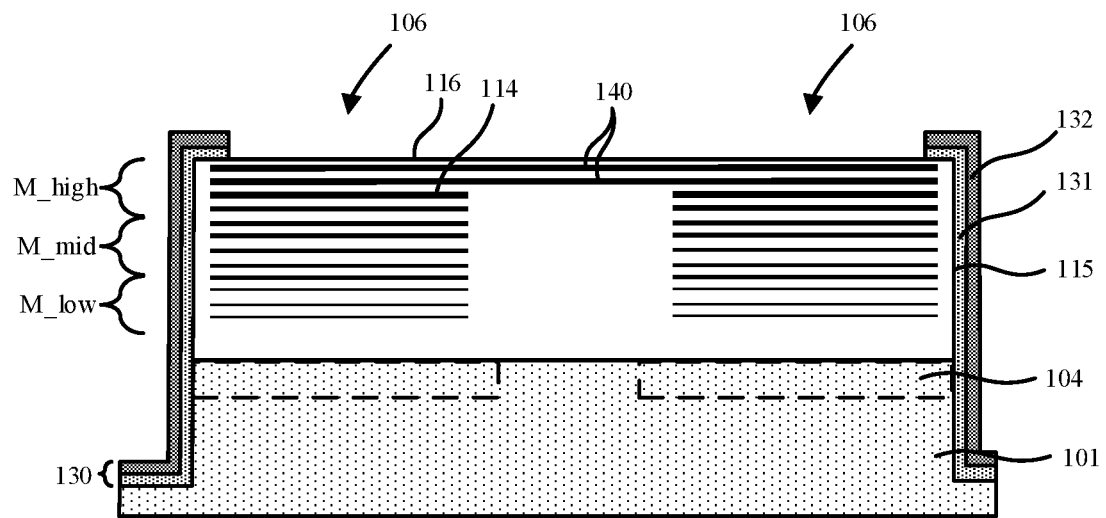
FIG. 9 is a schematic cross-sectional side view illustration of a conformal sealing layer formed around a die set in accordance with an embodiment.
Figure 10:
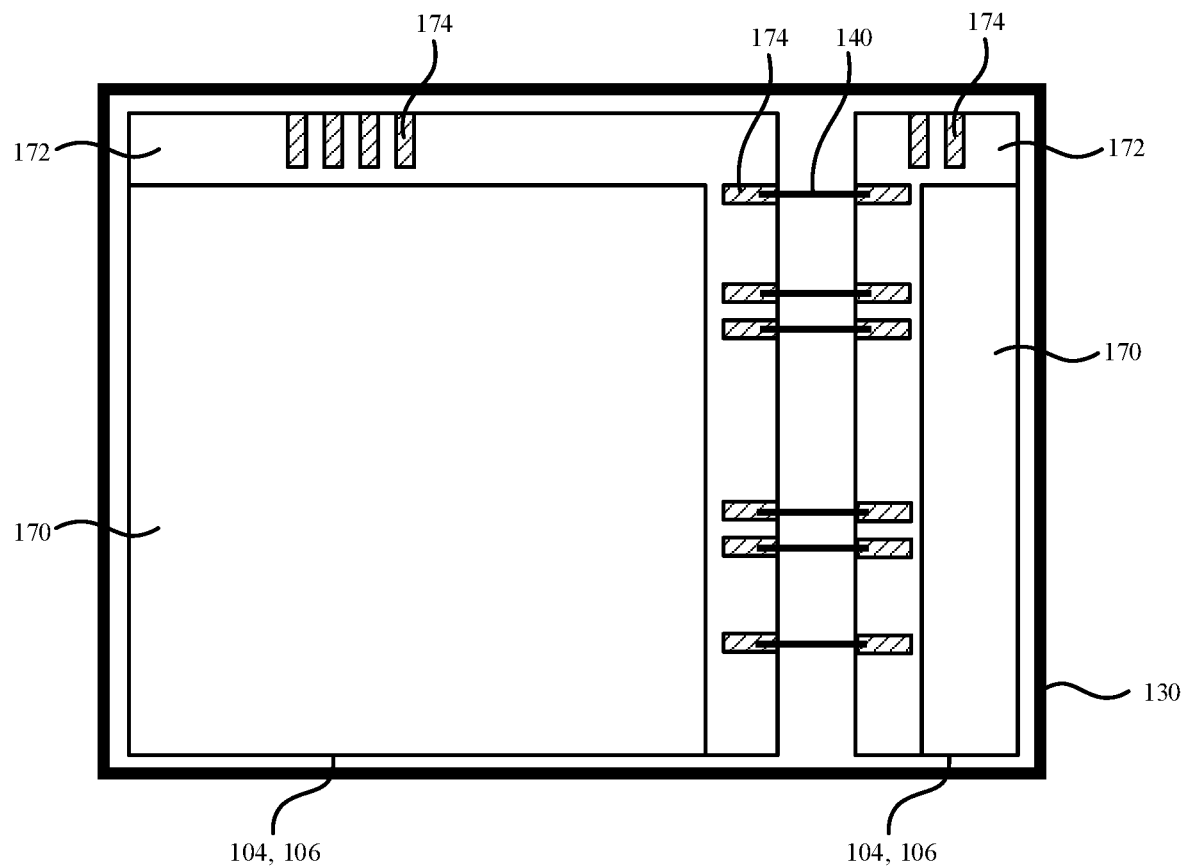
FIG. 10 is a schematic top view illustration of a conformal sealing layer formed around an die set in accordance with an embodiment.

Referring to FIGS. 9-10, FIG. 9 is a schematic cross-sectional side view illustration of a conformal sealing layer 130 formed around a die 106 set in accordance with an embodiment. FIG. 10 is a schematic top view illustration of a conformal sealing layer formed around a die set in accordance with an embodiment. As shown, the chip structures 100 can include internal die-to-die routing 140 connecting the adjacent dies 106. Thus, the embodiments illustrated in FIGS. 9-10 may correspond to sealing of a chip structure 100 including a 2X die set similar to that illustrated in FIG. 6.

Figure 11:
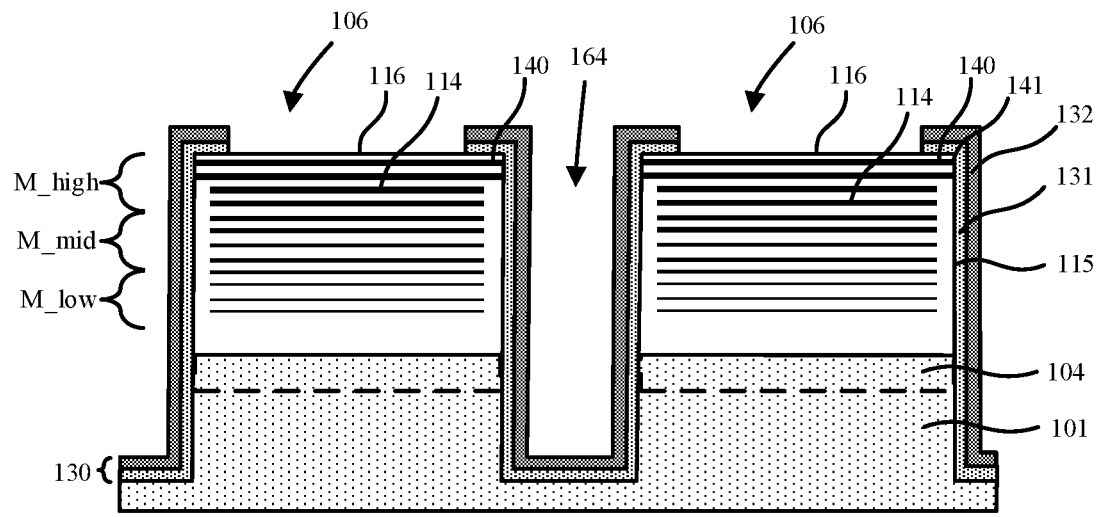
FIG. 11 is a schematic top view illustration of a conformal sealing layer formed around individual dies with diced die-to-die routing in accordance with an embodiment.
Figure 12:
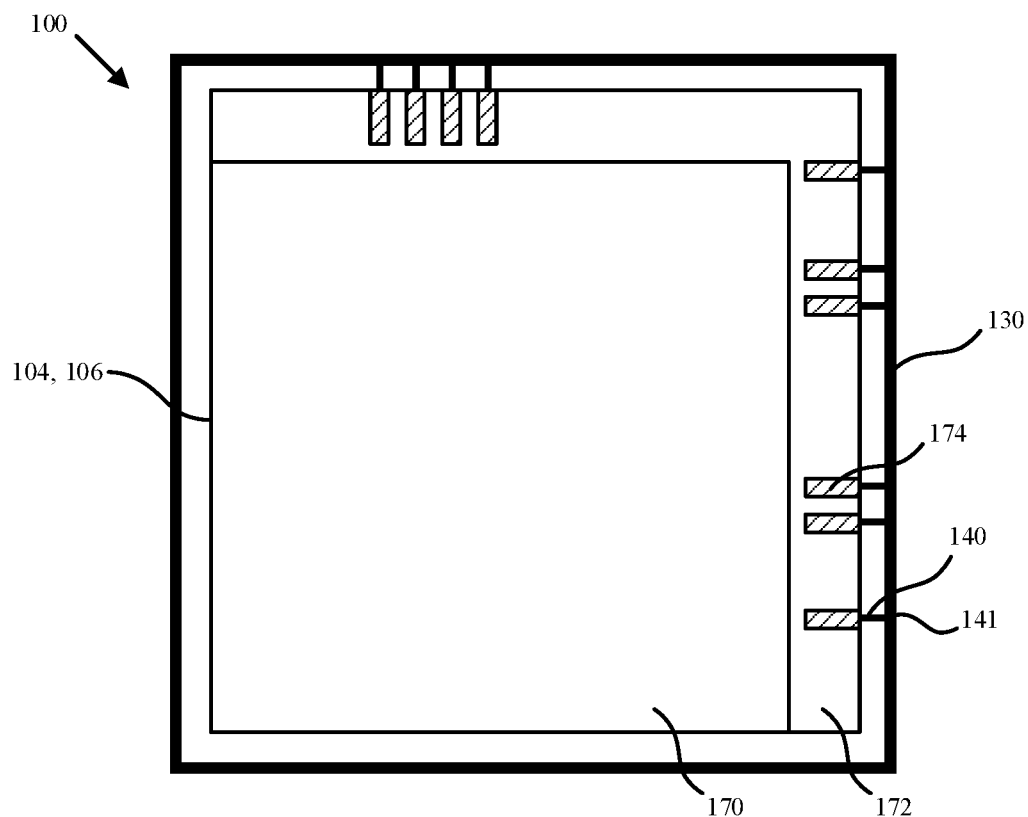
FIG. 12 is a schematic top view illustration of a conformal sealing layer formed around an die with diced die-to-die routing in accordance with an embodiment.

Referring to FIGS. 11-12, FIG. 11 is a schematic top view illustration of a conformal sealing layer 130 formed around individual dies 106 with diced die-to-die routing 140 in accordance with an embodiment. FIG. 12 is a schematic top view illustration of a conformal sealing layer formed around a die 106 with diced die-to-die routing 140 in accordance with an embodiment. The embodiments illustrated in FIGS. 11-12 may correspond to sealing of a chip structure 100 including a 1X' die set similar to that illustrated in FIG. 6.

Figure 13:
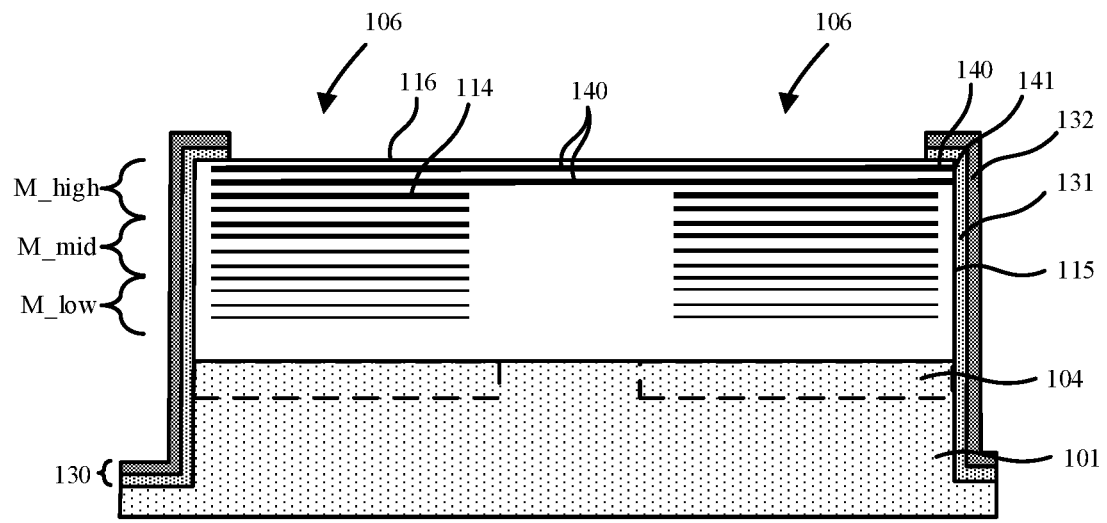
FIG. 13 is a schematic top view illustration of a conformal sealing layer formed around a die set with diced die-to-die routing in accordance with an embodiment.
Figure 14:
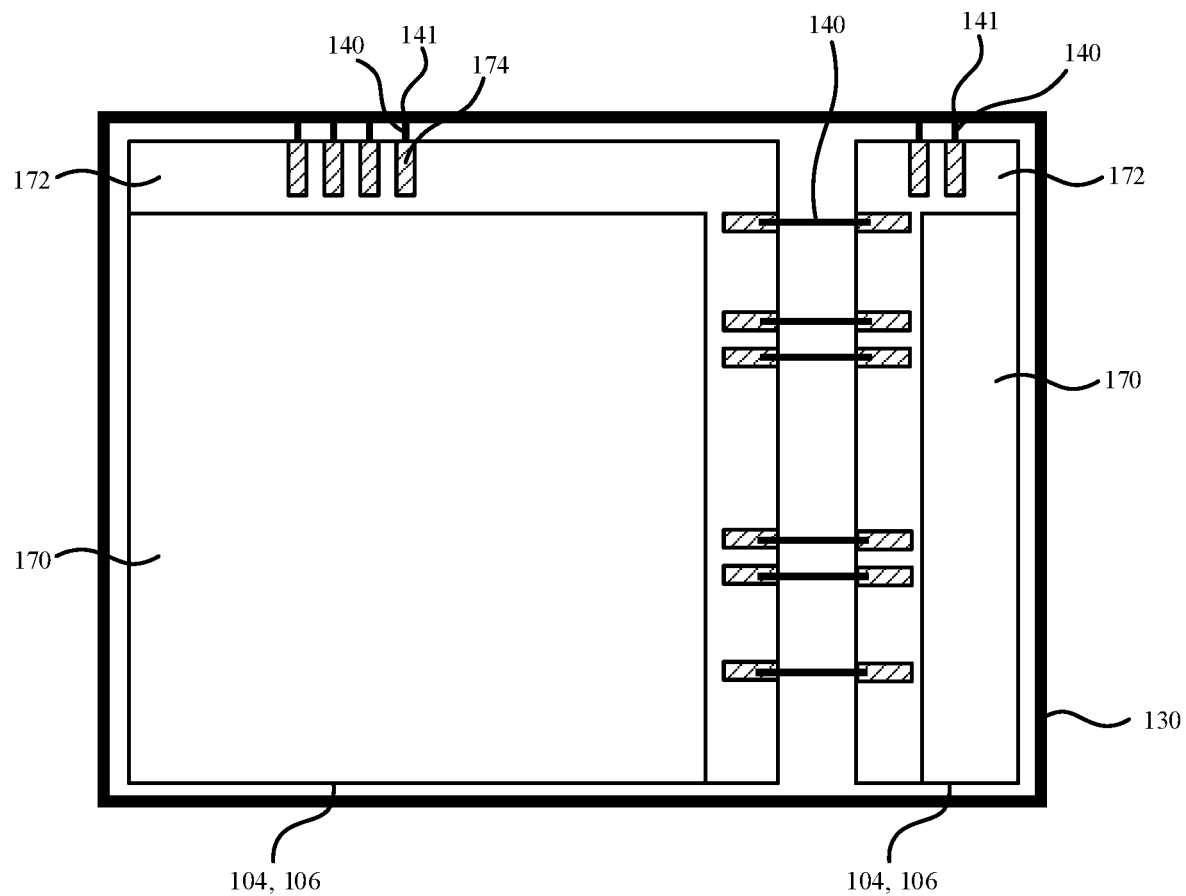
FIG. 14 is a schematic top view illustration of a conformal sealing layer formed around a die set with diced die-to-die routing in accordance with an embodiment.

Referring to FIGS. 13-14, FIG. 13 is a schematic top view illustration of a conformal sealing layer 130 formed around a die 106 set with diced die-to-die routing 140 in accordance with an embodiment. FIG. 14 is a schematic top view illustration of a conformal sealing layer formed around a die set with diced die-to-die routing in accordance with an embodiment. The embodiments illustrated in FIGS. 13-14 may correspond to sealing of a chip structure 100 including a 2X' die set similar to that illustrated in FIG. 6.

Figure 15:
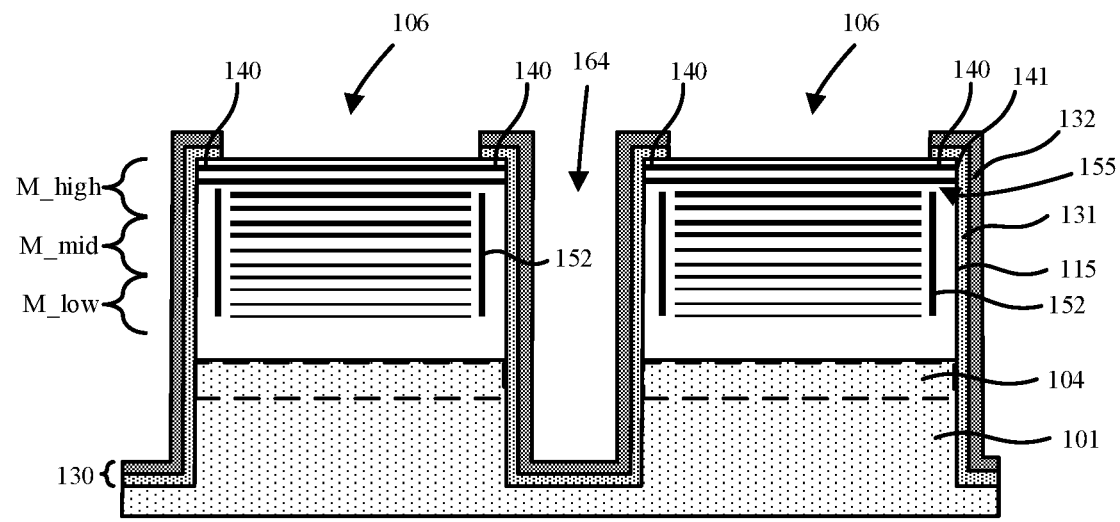
FIG. 15 is a schematic top view illustration of a conformal sealing layer formed around individual dies with partial metallic sealing structures and diced die-to-die routing in accordance with an embodiment.
Figure 16:
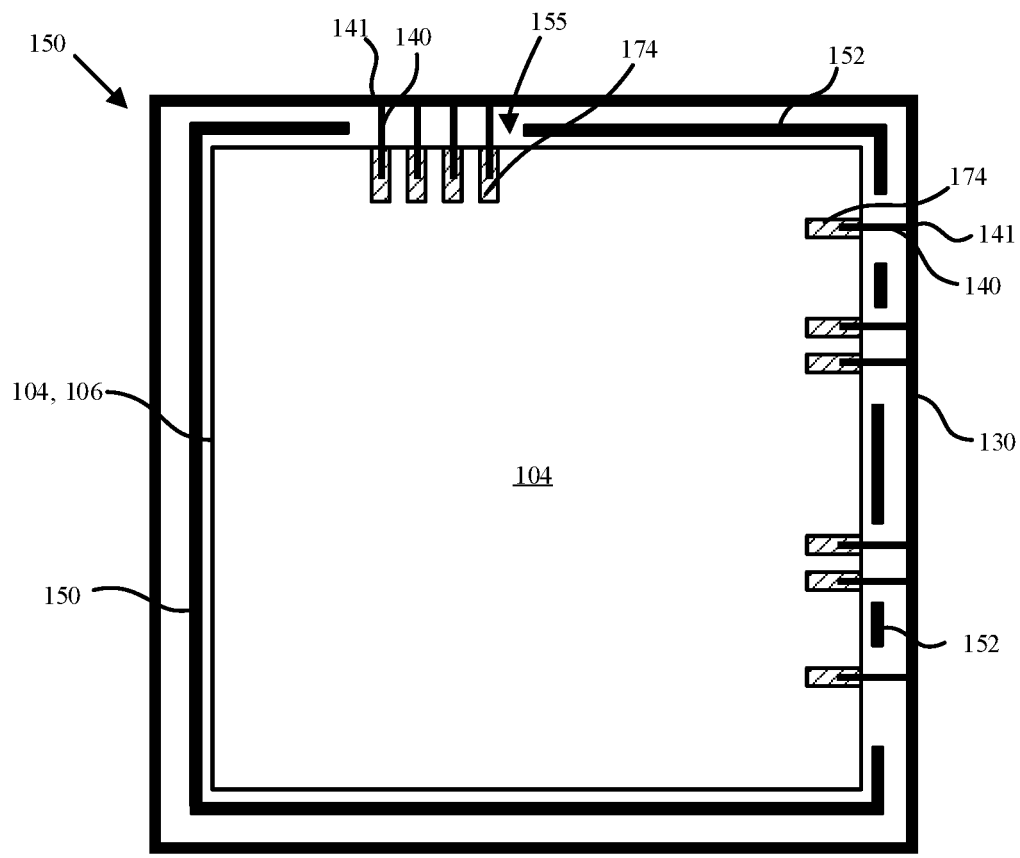
FIG. 16 is a schematic top view illustration of a conformal sealing layer formed around an die with partial metallic sealing structures diced die-to-die routing in accordance with an embodiment.

Referring to FIGS. 15-16, FIG. 15 is a schematic top view illustration of a conformal sealing layer 130 formed around individual dies 106 with partial metallic sealing structures 152 and diced die-to-die routing 140 in accordance with an embodiment. FIG. 16 is a schematic top view illustration of a conformal sealing layer formed around an die with partial metallic sealing structures 152 diced die-to-die routing 140 in accordance with an embodiment. In particular, FIGS. 15-16 illustrate the compatibility of the conformal sealing layer 130 with compromised, or partial metallic sealing structures 152 in accordance with embodiments. Full metallic sealing structures 150 can also be included. As shown, partial metallic sealing structures 152 can be formed partially or fully around the dies 106, with die-to-die routing 140 completed for desired die sets. Partial metallic sealing structures 152 can be incorporated to provide design flexibility for harvesting interconnected die sets, while full metallic sealing structure 150 can be incorporated to provide more robust physical and/or electrical protection to the die within a chip structure 100. The conformal sealing layer 130 can fully seal the chip edges sidewalls 115 adjacent the partial metallic sealing structures 152.

Figure 17:
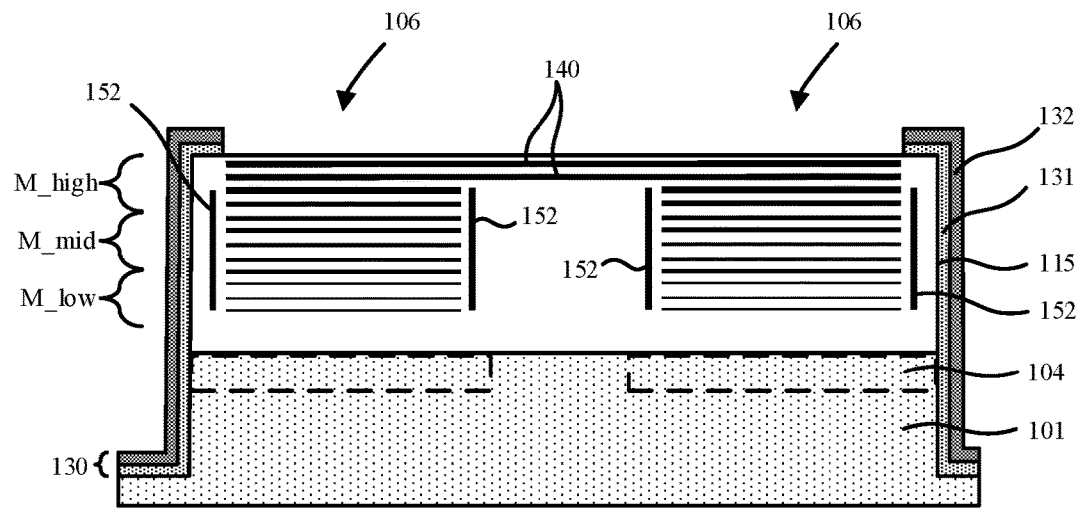
FIG. 17 is a schematic top view illustration of a conformal sealing layer formed around a die set with partial metallic sealing structures in accordance with an embodiment.
Figure 18:
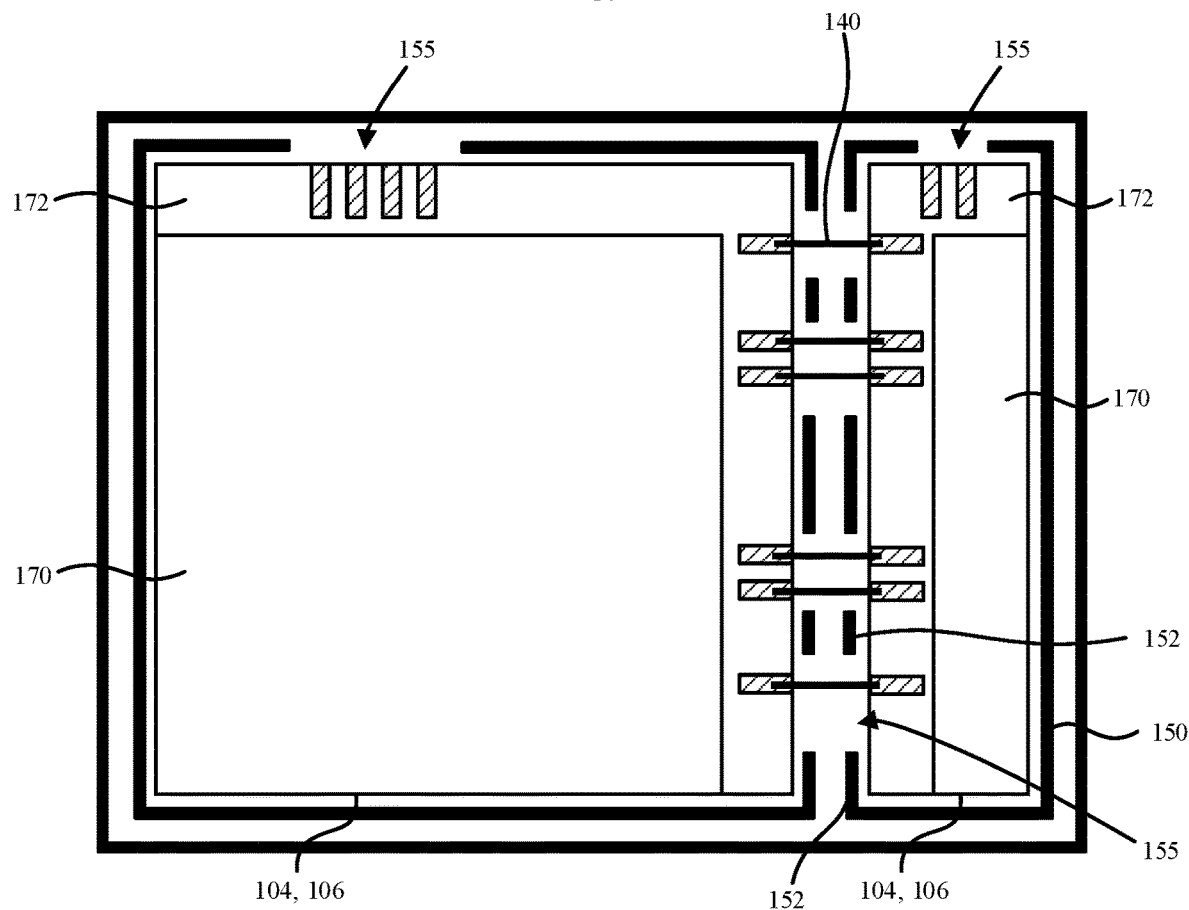
FIG. 18 is a schematic top view illustration of a conformal sealing layer formed around a die set with partial metallic sealing structures in accordance with an embodiment.

Referring to FIGS. 17-18, FIG. 17 is a schematic top view illustration of a conformal sealing layer 130 formed around a die 106 set with partial metallic sealing structure 152 in accordance with an embodiment. FIG. 18 is a schematic top view illustration of a conformal sealing layer formed around a die set with partial metallic sealing structure 152 in accordance with an embodiment. FIGS. 17-18 are substantially similar to those illustrated in FIGS. 15-16, with a difference being that dicing is not performed through the die-to-die routing 140. Similarly, the conformal sealing layer 130 can fully seal the chip edges sidewalls 115 adjacent the partial metallic sealing structures 152.

While not separately illustrated, it is to be appreciated that the conformal sealing layer 130 of FIGS. 17-18 can be formed along a single, multiple, or all chip edge sidewalls 115. For example, where an internal full metallic seal structure 150 is located adjacent a chip edge sidewall 115, the conformal sealing layer 130 is optional.

In utilizing the various aspects of the embodiments, it would become apparent to one skilled in the art that combinations or variations of the above embodiments are possible for forming sealed chip structure. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A chip structure comprising:
    a main body area including:
        a substrate including a front side and a back surface opposite the front side;
        a back-end-of-the-line (BEOL) build-up structure spanning over the front side of the substrate;
        chip edge sidewalls extending from a back surface of the substrate to a top surface of the BEOL build-up structure and laterally surrounding the substrate and the BEOL build-up structure; and
    a conformal sealing layer covering at least a first chip edge sidewall of the chip edge sidewalls from the back surface of the substrate to the top surface of the BEOL build-up structure and a portion of the top surface of the BEOL build-up structure, wherein the conformal sealing layer forms a lip around the top surface of the BEOL build-up structure.

2. The chip structure of claim 1, wherein the conformal sealing layer covers all of the chip edge sidewalls.

3. The chip structure of claim 1, wherein the conformal sealing layer applies a compressive stress to the main body area.

4. The chip structure of claim 1, wherein the substrate comprises silicon, and the conformal sealing layer is characterized by a higher coefficient of thermal expansion (CTE) than silicon.

5. The chip structure of claim 1, wherein the BEOL build-up structure does not include a metallic sealing structure.

6. The chip structure of claim 1, wherein further comprising a plurality of devices formed in the BEOL build-up structure.

7. The chip structure of claim 1, wherein the substrate is a semiconductor substrate, and further comprising a first front end of the line (FEOL) die area of a first die patterned into the semiconductor substrate.

8. The chip structure of claim 7, wherein the first FEOL die area includes a plurality of passive devices.

9. The chip structure of claim 7, wherein the first FEOL die area includes a plurality of active devices.

10. The chip structure of claim 7, wherein the BEOL build-up structure comprises a die-to-die routing connected between the first FEOL die area and a terminal end of the die-to-die routing at the first chip edge sidewall.

11. The chip structure of claim 10, wherein the BEOL build-up structure includes a metallic sealing structure, and the die-to-die routing extends through an opening vertically oriented with the metallic sealing structure.

12. The chip structure of claim 7:
    further comprising a second FEOL die area of a second die patterned into the semiconductor substrate;
    wherein the BEOL build-up structure spans over the second FEOL die area; and
    wherein the chip edge sidewalls laterally surround the first FEOL die area, the second FEOL die area, and the BEOL build-up structure.

13. The chip structure of claim 12, wherein the BEOL build-up structure further comprises a die-to-die routing connecting the first FEOL die area and the second FEOL die area.

14. The chip structure of claim 13, wherein the BEOL build-up structure further comprises a second die-to-die routing connected between first FEOL die area and a terminal end of the second die-to-die routing at the chip edge sidewall.

15. The chip structure of claim 1, wherein the conformal sealing layer does not cover the back surface of the substrate.

16. The chip structure of claim 15, wherein the conformal sealing layer comprises a metallic layer.

17. The chip structure of claim 15, wherein the conformal sealing layer comprises an insulating material layer.

18. The chip structure of claim 1, wherein the back surface of the substrate and the conformal sealing layer form a planar surface.

* * * * *